(12) United States Patent
Mohammed

(10) Patent No.: US 10,658,148 B2
(45) Date of Patent: May 19, 2020

(54) ATTOMICROSCOPY: ATTOSECOND ELECTRON IMAGING AND MICROSCOPY

(71) Applicant: ARIZONA BOARD OF REGENTS ON BEHALF OF THE UNIVERSITY OF ARIZONA, Tucson, AZ (US)

(72) Inventor: Mohammed Tharwat Hassan Mohammed, Tucson, AZ (US)

(73) Assignee: ARIZONA BOARD OF REGENTS OF BEHALF OF THE UNIVERSITY OF ARIZONA, Tucson, AZ (US)

( * ) Notice: Subject to any disclaimer, the term of this patent is extended or adjusted under 35 U.S.C. 154(b) by 0 days.

(21) Appl. No.: 16/394,920

(22) Filed: Apr. 25, 2019

(65) Prior Publication Data

US 2019/0333731 A1 Oct. 31, 2019

Related U.S. Application Data

(60) Provisional application No. 62/664,686, filed on Apr. 30, 2018.

(51) Int. Cl.
*H01J 37/06* (2006.01)
*H01J 37/22* (2006.01)
*H01J 37/05* (2006.01)

(52) U.S. Cl.
CPC .............. *H01J 37/06* (2013.01); *H01J 37/05* (2013.01); *H01J 37/226* (2013.01)

(58) Field of Classification Search
CPC ........... H01J 37/06; H01J 37/05; H01J 37/226
See application file for complete search history.

(56) References Cited

U.S. PATENT DOCUMENTS

| 9,053,903 | B2 * | 6/2015 | Zewail | H01J 37/22 |
| 10,212,796 | B2 * | 2/2019 | Kaertner | H05G 2/00 |
| 2011/0220792 | A1 * | 9/2011 | Zewail | H01J 37/244 250/307 |
| 2013/0161539 | A1 * | 6/2013 | Payeur | H01J 31/00 250/493.1 |
| 2014/0131574 | A1 * | 5/2014 | Zewail | H01J 37/26 250/307 |

(Continued)

OTHER PUBLICATIONS

Mohammed, M., TH., "Optical attosecond pulses and tracking the nonlinear response of bound electrons," Nature, vol. 530, Feb. 4, 2016, 17 pages.

(Continued)

*Primary Examiner* — Brooke Purinton
(74) *Attorney, Agent, or Firm* — Quarles & Brady LLP; Yakov Sidorin

(57) ABSTRACT

System and method for Ultrafast Electron Diffraction (UED) and Microscopy (UEM) configured to image atomic motion in real time with sub-femtosecond temporal resolution. Presented methodology utilizes the interaction of the pump optical pulse with the initial electron pulse that has been gated with the gating optical pulse. The initial electron pulse is generated in the electron microscope by the pulse of auxiliary light. In one case, the pump and gating pulses have attosecond duration and are duplicates of one another. The use of attosecond optical pulse (with frequency spectrum extending over two octaves in the visible and flanking spectral ranges) for optical gating of a pulse of electrons.

20 Claims, 12 Drawing Sheets

(56) References Cited

U.S. PATENT DOCUMENTS

| 2015/0123010 A1* | 5/2015 | Hirsch | H01J 37/073 |
| | | | 250/424 |
| 2017/0123291 A1* | 5/2017 | Vampa | G02F 1/353 |
| 2017/0271123 A1* | 9/2017 | Talebi Sarvari | H01J 37/226 |
| 2019/0242819 A1* | 8/2019 | Frumker | G01N 21/4795 |

OTHER PUBLICATIONS

Harrison, R. W., "Phase problem in crystallography," Optical Society of America, vol. 10, No. 5, May 1993, pp. 1046-1055.

Shechtman, Y., et al., "Phase Retrieval with Application to Optical Imaging," IEEE Signal Processing Magazine, No. 87, May 2015, 23 pages.

Fienup, J. R., et al., "Phase-retrieval stagnation problems and solutions," Optical Society of America, vol. 3, No. 11, Nov. 1986, 11 pages.

Fienup, J. R., "Phase retrieval algorithms: a comparison," Applied Optics, vol. 21, No. 15, Aug. 1982, 12 pages.

Millane, R. P., "Phase retrieval in crystallography and optics," Optical Society of America, vol. 7, No. 3, Mar. 1990, 18 pages.

Jaganathan, L., "Phase Retrieval: An Overview of Recent Developments," Department of Electrical Engineering, Technion, Israel Institute of Technology, Oct. 26, 2015, 24 pages.

Fienup, J. R., "Phase retrieval algorithms: a personal tour [Invited]", The Institute of Optics, University of Rochester, Rochester, New York, Dec. 12, 2012, 12 pages.

Mohammed, M., TH., "Attomicroscopy: from femtosecond to attosecond electron microscopy," Journal of Physics B: Atomic, Molecular and Optical Physics, vol. 51, downloaded from IP address 150.135.51.31 on Jul. 3, 2018 at 20:52, 31 pages.

* cited by examiner

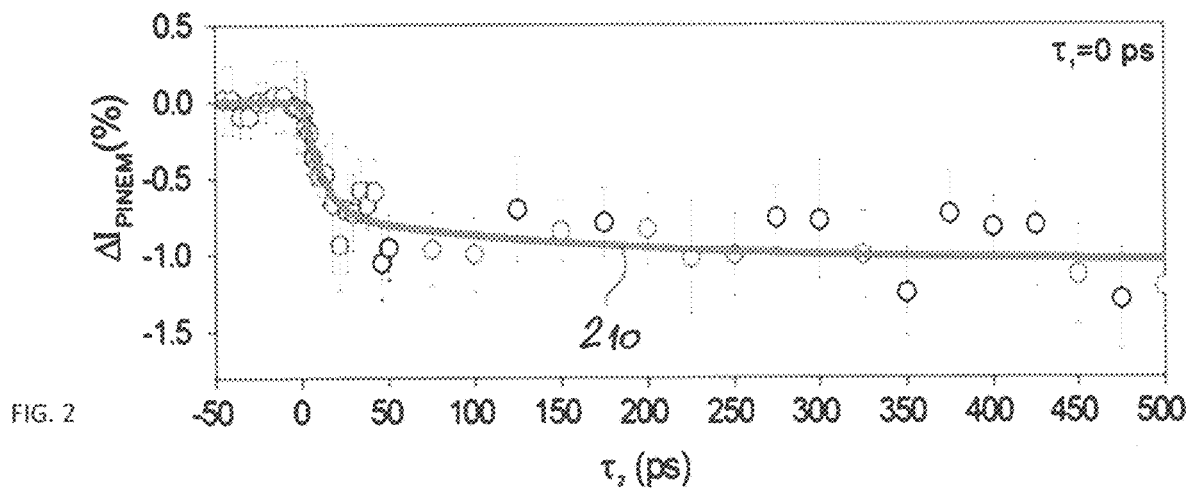
FIG. 2
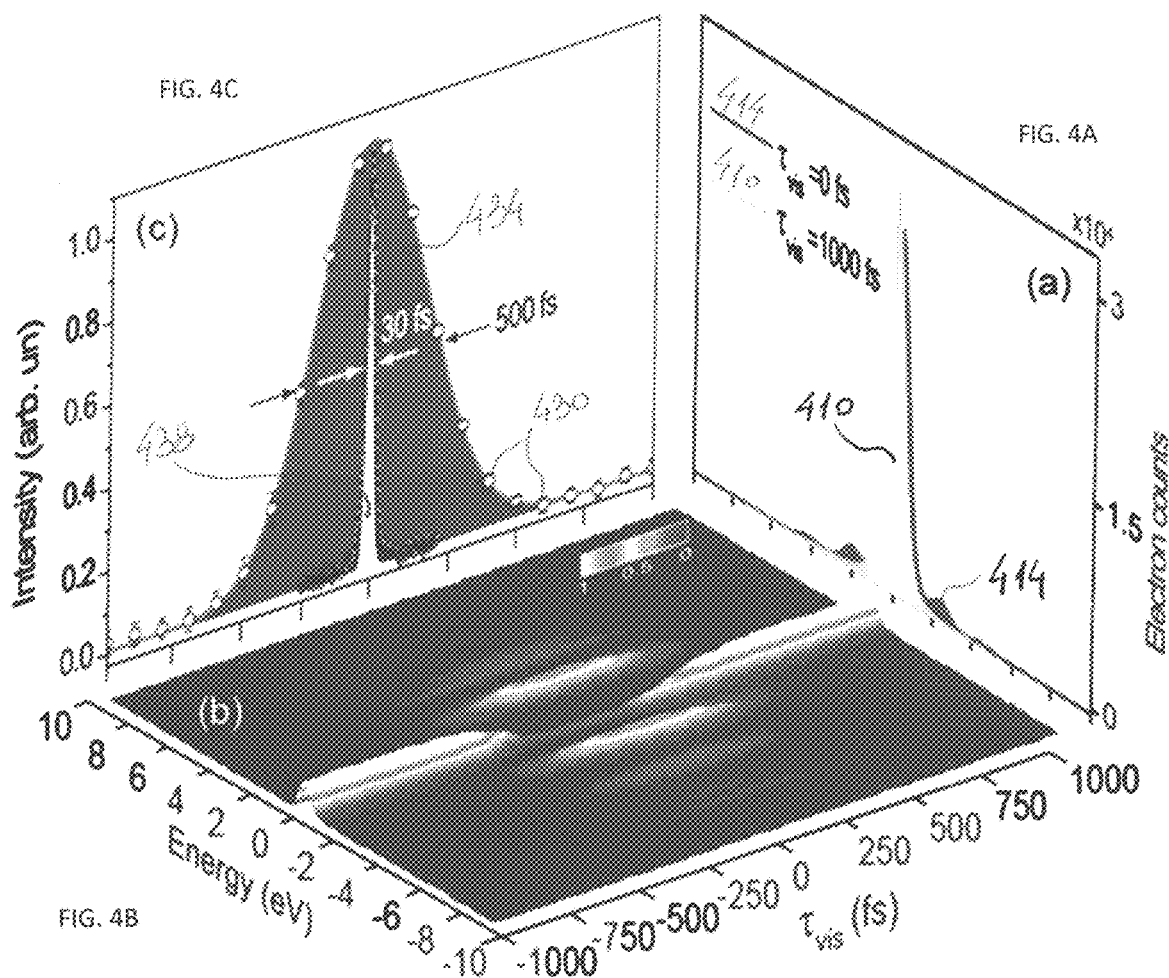

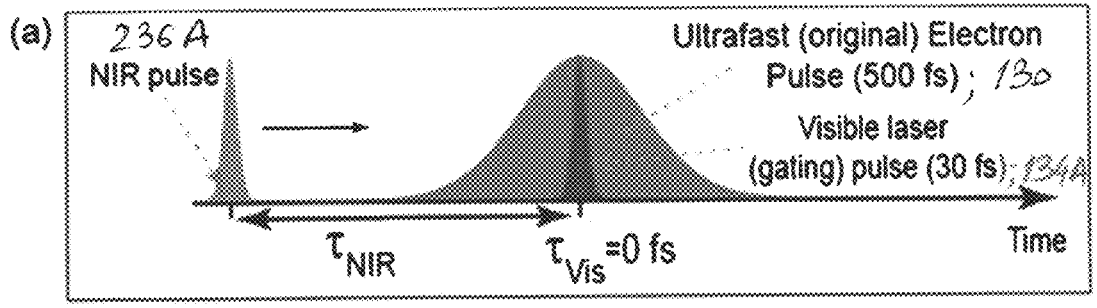
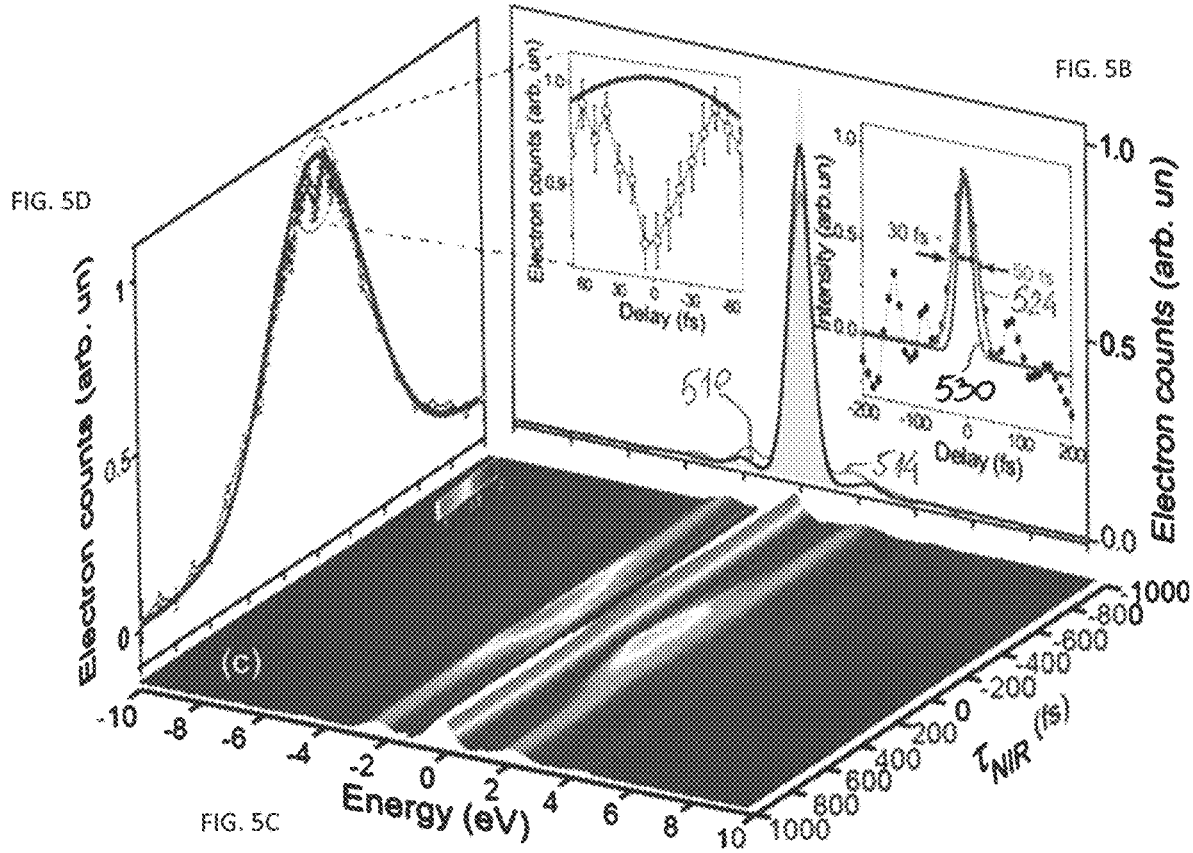

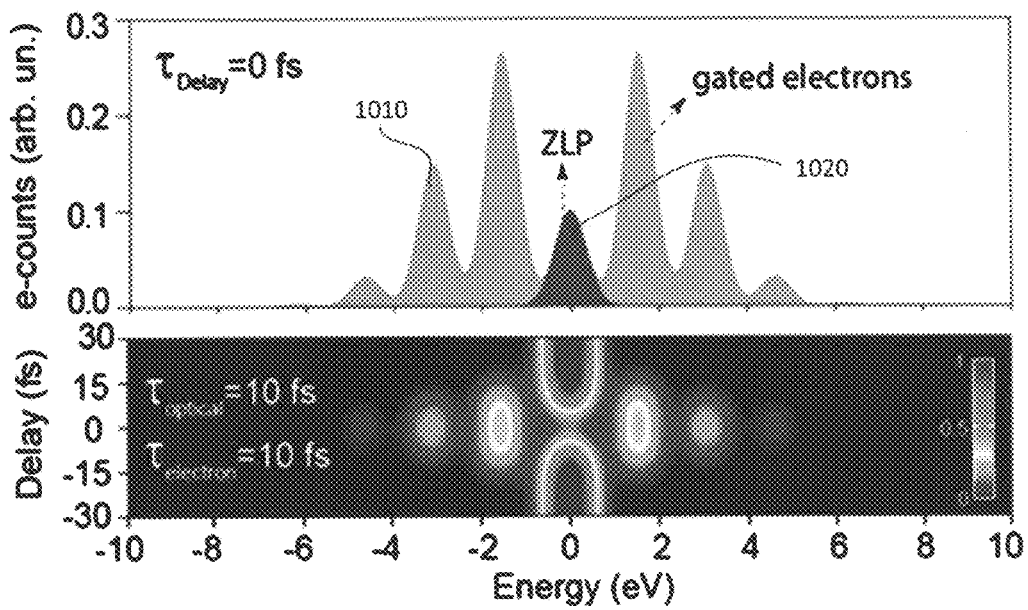
FIG. 10A
FIG. 10B
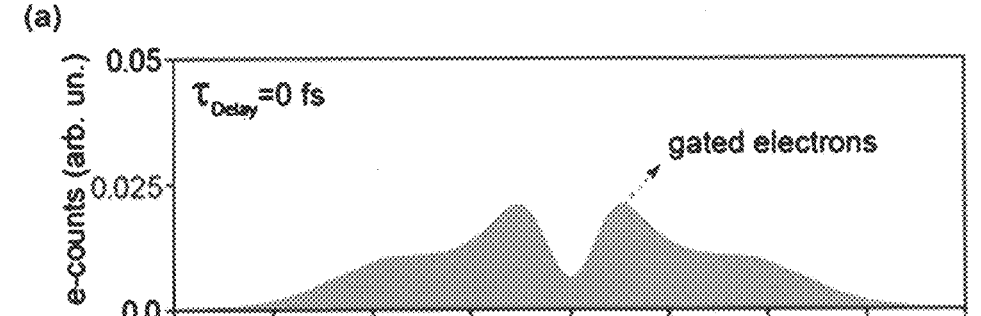
FIG. 11A
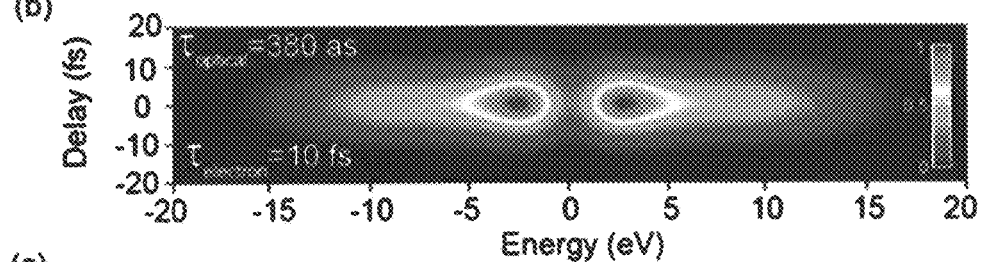
FIG. 11B
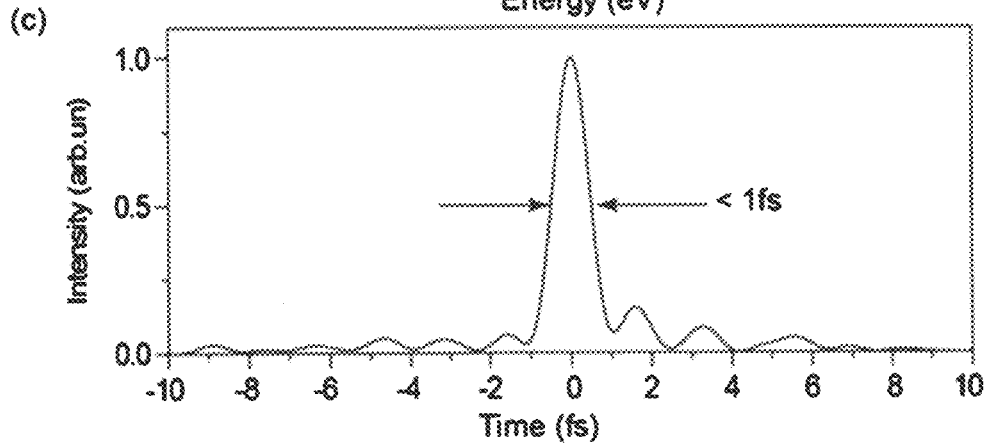
FIG. 11C

```
┌─────────────────────────────────────────────────────────────────────┐
│  GENERATE FIRST GROUP OF ELECTRONS AT THE SAMPLE IN A FORM OF FIRST │
│                   ELECTRON PULSE                    1310            │
└─────────────────────────────────────────────────────────────────────┘
                                   │
                                   ▼
┌─────────────────────────────────────────────────────────────────────┐
│  GENERATE SECOND GROUP OF ELECTRONS, AS SUBSET OF FIRST GROUP, BY   │
│        IRRADIATING SAMPLE WITH FIRST LIGHT PULSE         1320       │
└─────────────────────────────────────────────────────────────────────┘

┌─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐
    │       STABILIZE TEMPORAL PHASE DIFFERENCE BETWEEN             │
    │    FIRST AND SECOND LIGHT PULSES TO A VALUE THAT IS           │
    │       NO LARGER THAN THAT CORRESPONDING TO                    │
    │          DURATION OF FIRST LIGHT PULSE      1320A             │
    └─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
                                   │
                                   ▼
┌─────────────────────────────────────────────────────────────────────┐
│    IRRADIATE SECOND GROUP OF ELECTRONS WITH SECOND LIGHT PULSE TO   │
│       FORM IRRADIATED SECOND GROUP OF ELECTRONS         1330        │
└─────────────────────────────────────────────────────────────────────┘
                                   │
                                   ▼
┌─────────────────────────────────────────────────────────────────────┐
│  ACQUIRE ENERGY SPECTRUM OF IRRADIATED SECOND GROUP OF ELECTRONS    │
│  TO FORM SERIES OF IMAGES OF SAMPLE WITH TIME-RESOLUTION VALUE THAT │
│            IS SMALLER THAN 1 FEMTOSECOND              1340          │
└─────────────────────────────────────────────────────────────────────┘
```

FIG. 13

```
┌─────────────────────────────────────────────────────────────────────┐
│  FORM GATED ELECTRON PULSE FROM INITIAL ELECTRON PULSE WITH USE OF FIRST │
│           OPTICAL PULSE AT OBJECT MATERIAL        1410              │
└─────────────────────────────────────────────────────────────────────┘

┌─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─┐
│  ADJUST PHASE DIFFERENCE BETWEEN FIRST AND SECOND OPTICAL PULSES    │
│         ┌─ ─ ─ ─ ─ ─ ─ ─ ─ ─ ─ ─ ─ ─ ─ ─ ─ ─ ─ ─ ─ ─ ─ ─ ─ ─ ─ ─ ┐  │
│         │  ACTIVELY PHASE-LOCK FIRST AND SECOND OPTICAL PULSES   │  │
│  1420   └─ ─ ─ ─ ─ ─ ─ ─ ─ ─ ─ ─ ─ ─ ─ ─ ─ ─ ─ ─ ─ ─ ─ ─ ─ ─ ─ ─ ┘  │
└─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─┘
```

  

```
┌─────────────────────────────────────────────────────────────────────┐
│        SPATIALLY OVERLAP SECOND OPTICAL PULSE WITH GATED ELECTRON PULSE │
│  1430   ┌─ ─ ─ ─ ─ ─ ─ ─ ─ ─ ─ ─ ─ ─ ─ ─ ─ ─ ─ ─ ─ ─ ─ ─ ─ ─ ─ ─ ┐  │
│         │   SCAN GATED ELECTRON PULSE WITH SECOND OPTICAL PULSE  │  │
│         │                                                  1440  │  │
│         └─ ─ ─ ─ ─ ─ ─ ─ ─ ─ ─ ─ ─ ─ ─ ─ ─ ─ ─ ─ ─ ─ ─ ─ ─ ─ ─ ─ ┘  │
│  ┌───────────────────────────────────────────────────────────────┐  │
│  │   FORM DIFFRACTION PATTERN OF GATED ELECTRON PULSE IN FAR-FIELD│  │
│  │                                                         1430A │  │
│  └───────────────────────────────────────────────────────────────┘  │
│  ┌───────────────────────────────────────────────────────────────┐  │
│  │ FORM SERIES OF IMAGES OF ELECTRON DINAMICS BY ACQUIRING ENERGY OF│  │
│  │           SAID DIFFRACTION PATTERN                      1430B │  │
│  └───────────────────────────────────────────────────────────────┘  │
└─────────────────────────────────────────────────────────────────────┘
```

FIG. 14

```
┌─────────────────────────────────────────────────────────────────────────┐
│  FORM ATTOSECOND OPTICAL PULSE BY COLLINEARLY AND TEMPORALLY-COHERENTLY │
│  OVERLAPPING INDIVIDUAL COMPRESSED OPTICAL PULSES FORMED FROM ORIGINAL  │
│  OPTICAL PULSE SPATIALLY AND SPECTRALLY SPLIT ALONG CONSTITUENT         │
│  DIFFERENT OPTICAL PATHS                                                │
│                                                                   1510  │
│   ┌─────────────────────────────────────────────────────────────────┐   │
│   │ DELAY FIRST OPTICAL PULSE PROPAGATING ALONG FIRST OPTICAL PATH  │   │
│   │ BY TIME-AMOUNT DIFFERENT FROM THAT BY WHICH SECOND OPTICAL      │   │
│   │ PULSE PROPAGATING ALONG SECOND OPTICAL PATH IS DELAYED   1510A  │   │
│   └─────────────────────────────────────────────────────────────────┘   │
└─────────────────────────────────────────────────────────────────────────┘
                                    │
                                    ▼
┌─────────────────────────────────────────────────────────────────────────┐
│           IRRADIATE OBJECT WITH ATTOSECOND PULSE      1520              │
│   ┌─────────────────────────────────────────────────────────────────┐   │
│   │  GENERATE GROUP OF FREE ELECTRONS AT THE OBJECT WHILE    1530   │   │
│   │         IRRADIATING OBJECT WITH ATTOSECOND PULSE                │   │
│   │   ┌─────────────────────────────────────────────────────────┐   │   │
│   │   │ GENERATED GROUP OF FREE ELECTRONS IS CONFIGURED AS      │   │   │
│   │   │ ELECTRON PULSE HAVING DURATION IN FEMTOSECOND RANGE     │   │   │
│   │   │                                                   1530A │   │   │
│   │   └─────────────────────────────────────────────────────────┘   │   │
│   └─────────────────────────────────────────────────────────────────┘   │
└─────────────────────────────────────────────────────────────────────────┘
                                    │
                                    ▼
┌─────────────────────────────────────────────────────────────────────────┐
│  FORM SERIES OF IMAGES OF ELECTRON DINAMICS BY ACQUIRING ENERGY OF      │
│  SUB-PORTION OF GROUPS OF FREE ELECTRONS GATED WITH ATTOSECOND PULSE    │
│                                                                   1540  │
└─────────────────────────────────────────────────────────────────────────┘
```

FIG. 15

ATTOMICROSCOPY: ATTOSECOND ELECTRON IMAGING AND MICROSCOPY

CROSS-REFERENCE TO RELATED APPLICATIONS

The present application claims priority from and benefit of the U.S. Provisional Patent Application No. 62/664,686 filed on Apr. 30, 2018 and titled "Attomicroscopy: Generation of an Attosecond Pulse of Electrons". The disclosure of the above-identified provisional patent application is incorporated herein by reference.

TECHNICAL FIELD

The present invention relates generally to method and systems for generation of attosecond electron pulse and, more particularly, to a system configured to image electron dynamics on an attosecond time-scale and related methodologies.

BACKGROUND

The task of imaging of ultrafast dynamics of a sample with the use of electron microscopy dictates a need to enhance the temporal resolution of the electron microscopy modality. Such enhancement—and, in particular, the increase in temporal resolution of an electron microscope—can be achieved with the use of ultrashort optical laser pulses in what is referred to as "optical gating", in the process of which a portion of the pulse of free electrons is temporally-filtered or gated as a result of inelastic scattering between the electrons and photons that causes the photon-electron coupling. What results is a portion of the electron pulse with a temporal profile substantially similar to the temporal profile of the gating pulse of light.

SUMMARY

Embodiments of the invention provide an attomicroscopy system, that includes an electron microscope having a photocathode and a specimen-holder configured to support a chosen material specimen; and a first source configured to generate a beam of first light having a first bandwidth and carrying first light pulses, the system configured to have the beam of the first light delivered to the photocathode. The system additionally includes a second source configured to generate a beam of second light having a second bandwidth and carrying second light pulses, the system configured to have the beam of the second light irradiate contents of the specimen holder; and a third source configured to generate a beam of third light having a third bandwidth and carrying third light pulses, the system configured to have the beam of the third light irradiate a location in the vicinity of the contents of the specimen holder. The system further includes a time-delay optical relay system intersecting at least one of the beam of the second light and the beam of the third light to cause a phase difference be actively phase-locked with precision of less than 1 femtosecond, wherein the phase difference is defined as a difference between a first phase of a pulse from the first light pulses and a second phase of a pulse from the second light pulses.

Depending on the specific implementation, a) the third source may include an optical beam splitter disposed across the beam of the second light to from the beam of the third light that is spatially-separated from the beam of the second light and/or b) the second source includes a system containing optical beamsplitters and optical phase-delay devices, the second source configured i) to spatially-separate a fourth beam of light received by the system and having a fourth spectral bandwidth into a plurality of individual beams of light having respectively-corresponding spectral sub-bandwidths, wherein each of the sub-bandwidths is narrower than the fourth spectral bandwidth; and ii) to collinearly and temporally-coherently overlap at least two individual beams, of the plurality of individual beams, with one another to form said second beam, the second beam carrying light pulses of sub-femtosecond duration. In a particular implementation of the system of the invention, at least one of the following conditions is satisfied: (1) the second source includes at least one system configured to compress light pulses carried by at least two individual beams before these at least two individual beams are collinearly and temporally-coherently overlapped with one another; (2) the second source is configured to collinearly and temporally-coherently overlap all of the individual beams from the plurality of individual beams; (3) the second source includes an irradiance attenuator disposed across an individual beam, from the plurality of individual beams, and configured to adjust an irradiance of such individual beam to substantially equalize irradiances of at least two individual beams in question; and (4) at least one of the optical phase-delay devices includes an optical wedge disposed across at least one of the individual beams in question. Notably, the system may include a source of the fourth beam of light which light has a fourth spectral bandwidth that extends over at least two octaves across a visible spectral range and a flanking spectral range.

Embodiments of the invention provide a method for generating an electron pulse having a sub-femtosecond duration. The method includes the steps of: irradiating an object with an auxiliary femtosecond electron pulse; and irradiating the object, that has been irradiated with said auxiliary electron pulse, with an optical pulse having a sub-femtosecond duration to cause the object to emit the electron pulse having the attosecond duration. The method may include (i) spatially separating a first beam of light having a first spectral bandwidth into a plurality of second beams of light (here, each second beam from the plurality of the second beams of light has a corresponding second spectral bandwidth, and the first beam of light is a beam of pulsed laser light) and (ii) individually compressing light pulses of second beams, from the plurality of the second beams, to form a plurality of third beams of light (here, each third beam from said plurality of the third beams of light respectively corresponds to one of the second beams, and each third beam contains compressed light pulses having a corresponding attosecond compressed duration). The method additionally includes the process of collinearly and temporally-coherently overlapping at least two of the third beams to form a fourth beam of light that carries pulses of light having sub-femtosecond durations. The fourth beam of light is then employed to irradiate an object to cause the object to emit said electron pulse having the sough-after sub-femtosecond duration. In a specific implementation of the method, at least one of the following conditions is satisfied: a) the step of spatially separating the first beam of light into the plurality of the second beams of light includes spatially separating the first beam of light into the plurality of the second beams of light while second spectral bandwidths, corresponding to different second beams, do not overlap with one another; b) the step of individually compressing the light pulses of the second beams includes individually compressing light pulses of each of the second beams; and c) the step of collinearly and temporally-coherently overlapping at least two of the third beams includes collinearly and temporally-coherently overlapping all of the third beams. Alternatively or in addition, the step of spatially separating includes separating the first beam of light having the first spectral bandwidth that extends over at least two octaves across a visible spectral range and a flanking spectral range. Alternatively or in addition, the implementation of the method may further include at least one of the following:—generating the first beam of light via a nonlinear process of broadening of a spectrum of a laser pulse that has a femtosecond duration to form the first beam of light with the first spectral bandwidth that spans over at least two octaves a visible spectral range and a spectral range that immediately neighbors the visible spectral range; and— adjusting an irradiance value of at least one of the third beams to substantially equalize with one another irradiance values of at least two of the third beams. (In this latter implementation, the step of generating the first beam via the nonlinear process may be implemented with the use of broadening the spectrum as a result of passing the laser pulse through a volume of gas. In a related embodiment, the step of individually compressing includes at least one of the following: (1) forming said plurality of third beams in which each of the compressed durations is shorter than 10 femtoseconds, and (2) spatially separating the second beams from one another to pass the second beams along corresponding optical paths that differ from one another. Alternatively or in addition, the step of collinearly and temporally-coherently overlapping may include forming the forth beam to carry at least 80 percent of energy of the first beam.

Embodiments of the invention further provide a method for imaging an electron motion in real time. Such method includes the steps of (i) forming a gated electron pulse by spatially and temporally overlapping an initial electron pulse with a first optical pulse in the presence of an object material (where the first optical pulse having a first temporal profile, the gated electron pulse having a gated temporal profile and a first duration, the first duration being shorter than a femtosecond) and (ii) as a result of spatially overlapping a second optical pulse, having a second temporal profile, with the gated electron pulse: forming a diffraction pattern caused in a far-field by the gated electron pulse; and forming a series of images, representing object dynamics with a target temporal resolution, by acquiring energy of the gated electron pulse with an energy spectrometer. Alternatively or in addition, as a result of spatially overlapping the second optical pulse with the gated electron pulse, the formation of at least one of a) a series of direct images of the object by processing the gated electron pulse with the use of an electron microscope; and b) a series of images of the object based on diffraction patterns formed in a far-field by said gated electron pulse is effectuated. The diffraction pattern here represents cross-correlation of the second temporal profile with the gated temporal profile. In one implementation, the step of forming the gated electron pulse includes coupling the first optical pulse with an initial electron pulse (incident onto an object) in the presence of a material of the object while preserving a spatial overlap and a temporal overlap between the first optical pulse and the initial electron pulse. In such implementation, a temporal profile of the gated electron pulse is substantially equal to a temporal profile (attosecond) of the first optical pulse.

Alternatively or in addition, the method may further include actively phase-locking the first and second optical pulses to within a phase difference corresponding to a time extent of less than 1 femtosecond to cause the target temporal resolution to be better (higher) than one femtosecond. Alternatively or in addition, the method may include a step of changing a phase difference between a phase of the gated electron pulse and a phase of the second optical pulse with the use of active phase-locking between the first and second optical pulses in order to:

a) temporally scan the gated electron pulse with the second optical pulse, and b) define a temporal profile of said gated electron pulse from correlation between the gated electron pulse and the second optical pulse that has been determined as a result of temporally scanning of the gated electron pulse with the second optical pulse.

Alternatively or in addition, the method may further include a step of generating the first optical pulse by individually compressing durations of light pulses (that are carried by multiple light beams that propagate along different optical paths and that have different not-overlapping with one another spectral bandwidths) and collinearly and temporally-coherently overlapping the compressed light pulses from the multiple light beams. In a specific case of this latter instance, at least one of the following conditions is satisfied: (a) the method additionally includes the step of spatially separating a first beam of light having a first spectral bandwidth into the multiple light beams (here, the first spectral bandwidth extends over at least two octaves across a visible spectral range and a flanking spectral range); and (b) the method further includes the step of generating the second optical pulse by spatially-separating a portion of light carrying the first optical pulse.

Embodiments of the invention further provide a method for forming images of a sample with an electron microscope. Such method includes the steps of (a) generating a first group of free electrons, at a location at the sample, in a form of a first electron pulse having a first duration; and (b) forming a second group of free electrons in a form of a second electron pulse that has a second duration by irradiating the first group with a first pulse of light having a first light pulse duration and a first state of polarization. Here: the second group is a subset of the first group; the first light pulse duration at the location is equal to or shorter than a predetermined duration; the first duration is longer than the first light pulse duration; the second duration is substantially equal to the first light pulse duration; and the predetermined duration is the shortest duration supported by a spectral bandwidth of the first pulse of light. (In a specific embodiment, the predetermined duration is shorter than 100 fs, preferably shorter than 1 fs, and/or shorter than 500 attoseconds.) The method additionally includes the step of irradiating the second group with a second pulse of light having a second light pulse duration and a second state of polarization to form an irradiated second group. (Here, the first and second states of polarization are different from one another. In addition, the method includes the step of acquiring electron energy spectrum of the irradiated second group with an electron energy spectrometer to form a series of images of the sample with a time resolution of less than the predetermined resolution. The process of irradiating the second group may include irradiating the location at the sample. In one implementation, the predetermined duration is shorter than 100 fs. Alternatively or in addition, the second light pulse duration and the first light pulse duration are substantially equal. Alternatively or in addition, the processes of forming the second group and irradiating the second group include propagating the first laser pulse along a first optical path and propagating the second laser pulse along the second optical path to temporally overlap the first and second laser pulses at the location (here, the first and second optical path are different from one another). Alternatively or in addition, at least one of the forming the second group and the irradiating the second group includes propagating a laser pulse through a light dispersion compensator.

Alternatively or in addition, the method additionally comprises process of stabilizing a difference in temporal phase between the first and second laser pulses at the location by compensating time uttering between the first and second pulses of light with a time precision of less than the predetermined duration. In this latter case, the process of stabilizing includes adjusting an optical path difference between a first optical path and a second optical path, the first optical path being a path of propagation of the first pulse of light from a light source to the location, the second optical path being a path of propagation of the second pulse of light from the lights source to the location.

BRIEF DESCRIPTION OF THE DRAWINGS

The invention will be more fully understood by referring to the following Detailed Description of Specific Embodiments in conjunction with the Drawings, of which:

FIG. 2 illustrates the study of the phase transition in $VO_2$ nanoparticles with the use of the time-resolved photon-induced near-field electron microscopy (PINEM) system of FIG. 1. The relative change in the PINEM spectrum intensity $\Delta I$ as a function of the second optical pulse (pump) delay ($\tau_2$) is plotted using the black open circle points, where each data point represents the integration of the PINEM spectrum at time ($\tau_2$). The curve 210 is the biexponential fitting of the measured dynamics curve.

FIGS. 4A, 4B, 4C provide an example of characterization and optical gating of an ultrafast electron pulse 130 in an embodiment of the ultrafast electron microscopy. FIG. 4A: The electron energy spectrum of the "original" ultrafast electron pulse (ZLP spectrum) is shown as a lighter-color curve 410, and the coupling between the electron and the visible "gating" ($\hbar\omega$=2.25 eV) laser pulse is shown as a darker-color curve 414. FIG. 4B: Measured spectrogram of the electron energy spectra as a function of the "gating" visible laser pulse delay $\tau_{vis}$ is presented as a surface plot. FIG. 4C: The cross-correlation temporal profile is shown in open black circles 430, and the fitting is indicated by the dark-shaded region 434 and the curve that forms an envelope to that region: the cross-correlation profile obtained in this experiment has an FWHM of 500 fs. The internal-to-the-dark-shaded-region white area 438 and its envelope (the dotted line) represent the measured temporal gating window (the pulse duration of the "gating" visible pulse, of about 30 fs duration).

FIGS. 5A, 5B, 5C, and 5D illustrate temporal characterization of the gated isolated 30 fs electron pulse. FIG. 5A: Illustration of the gated electron pulse temporal characterization principle based on the cross-correlation measurement. FIG. 5B: The electron energy spectra of the coupling between "original" electron pulse 130 and "gating" visible pulse 134A is represented by the black line 510, while both the visible and NIR ($\hbar\omega$=1.675 eV) laser pulses 134A, 236A are represented by the red line 514. The spectrum of the "original" electron pulse (ZLP) 130 is indicated by the white reddish curve. FIG. 5C illustrates cross-correlation electron energy spectrogram of the electron-photon coupling between the NIR laser pulse 236A and both the "original" and "gated" electron pulses 130, 148. The ZLP is suppressed to obtain a clear illustration of the gating effect. FIG. 5D: The cross-correlation temporal profile retrieved from the measured spectrogram is shown in FIG. 5C by the connected open circles. This curve and its expanded view (inset in FIG. 5B on the left) clearly show the dip (reduction) in the electron counts due to the "gated" electron pulse 148. The right inset in FIG. 5B shows the cross-correlation temporal profile of the "gated" electron and NIR pulses 148, 236A, obtained by subtraction of the temporal profiles in FIG. 5D. It is plotted in black dots along with its fitting curve 524, and it has a FWHM in the order of 50 fs. A fit of the measured temporal profile of the "gating" window (visible pulse (30 fs)) is shown in curve 530.

FIG. 9A: The sampled streaking spectrogram; FIG. 9B: the retrieved electric field; and FIG. 9C: the instantaneous intensity of the OAP. The $\tau_{FWHM}$ duration of OAP is about 380 as.

FIGS. 10A, 10B illustrate a process of a few-cycle optical gating of an electron pulse. The calculated gated electron spectrogram of the 10 fs electron pulse with the 10 fs visible laser pulse centered at 800 nm is shown in FIG. 10B, and the outline of the electron spectrum at a delay time of 0 fs is shown in FIG. 10A. The gated electron spectrum is shown as area 1010, and the ZLP spectrum is shown in as area 1020.

FIGS. 11A, 11B, 11C: Attosecond optical gating of an electron pulse. FIG. 11A: Calculated spectrum of the gated electron pulse formed from the 10 fs electron pulse with the OAP pulse centred at 530 nm at a delay time=0 fs. FIG. 11B: Calculated full spectrogram from −20 to 20 fs. The spectral width of the coupling peaks is broader than the coupling peaks in case of multicycle pulse (see FIGS. 10A, 10B), since the OAP spectral FWHM=1.75 eV> the ZLP spectral FWHM=1 eV. FIG. 11C: Sub-femtosecond temporal window and the temporal profile of the OAP to generate the isolated attosecond electron pulses by optical gating.

FIGS. 13, 14, and 15 are schematic flow-charts of embodiments of a method of the invention.

Figure 1:
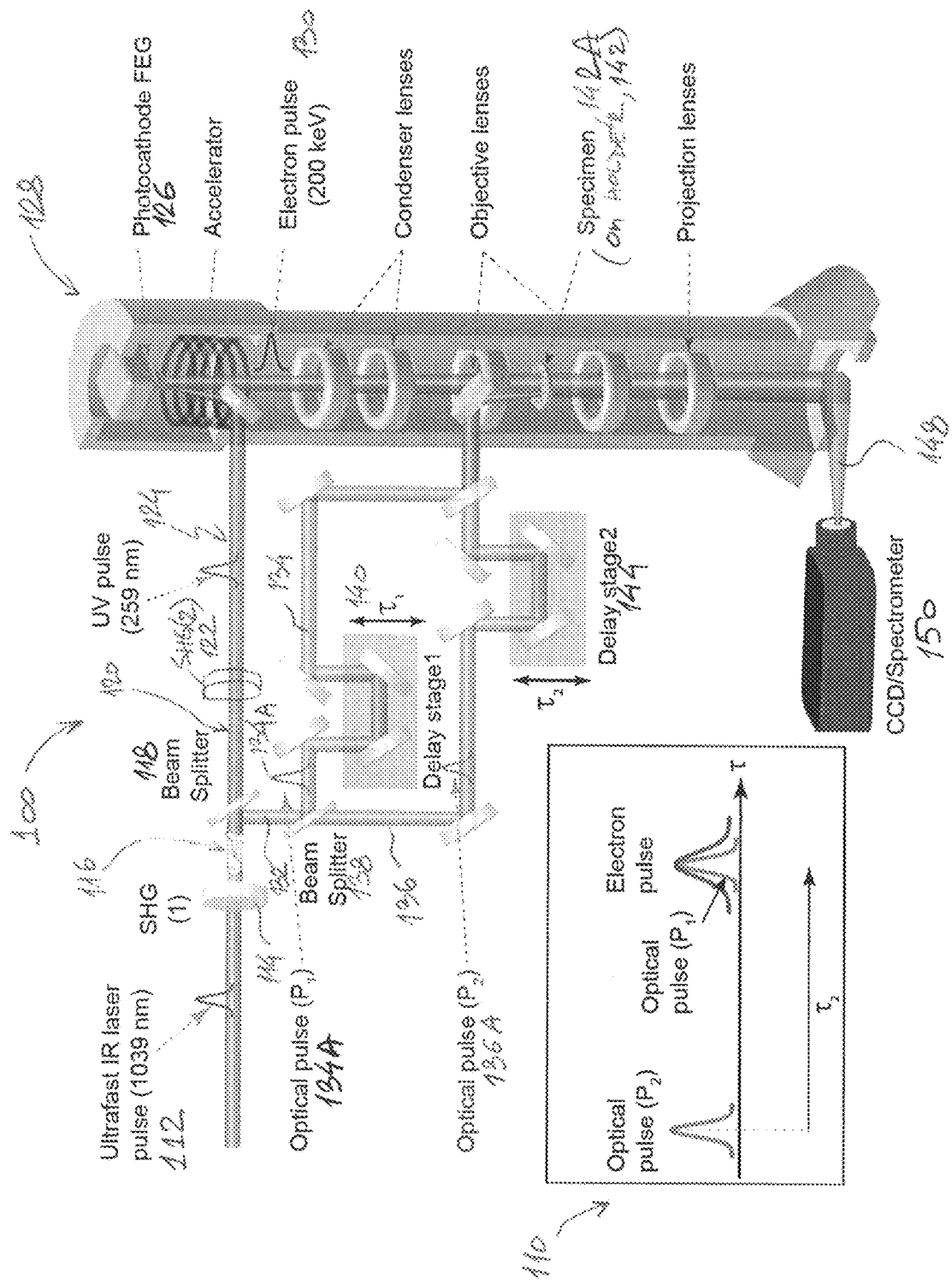
FIG. 1 illustrates schematically an embodiment of the electron-microscope-based system of the invention.

Generally, the sizes and relative scales of elements in Drawings may be set to be different from actual ones to appropriately facilitate simplicity, clarity, and understanding of the Drawings.

For the same reason, not all elements present in one Drawing may necessarily be shown in another.

DETAILED DESCRIPTION

Embodiments of the present invention address methodologies that employ a) enhancement of the temporal resolution for and imaging of electron motion with target resolutions that are better than 100 femtoseconds (preferably, better than one femtosecond, in which case such methodology is referred to as "attomicroscopy") and b) electron diffraction to measure and image the ultrafast atomic and electronic dynamics the durations of which are shorter than a pre-defined threshold of time—for example, a sub-100-fs duration of time (such as several tens of femtoseconds, or several femtoseconds) or even a shorter duration of time measured in attoseconds, for example a few hundred attoseconds or, in a specific example, about 400 attoseconds). The implementation of such methodologies requires the ability generate a correspondingly-short pulse of electrons. The pulse of electrons, formed at the surface of the chosen material sample and having a duration substantially equal to that of the "gating optical pulse" from a beam of light irradiating the cloud of electrons at the surface of the material sample, is further scanned or probed or triggered—as a result of interaction between such "gated" electron pulse and a trigger optical pulse, which forms the foundation for imaging the events at the material sample that occur on the time-scale shorter than 100 femtosecond and, in a specific case, on a sub-femtosecond scale.

The problem of inability of related art to increase the time-resolution of characterization (for example, imaging) of a material sample, with the use of an electron microscope (EM) system has been solved by employing two optical pulses to complement the interaction of the initial electron pulse, formed at the photocathode of the EM-system, with the material sample.

The first optical pulse, referred to as a "gating optical pulse" and having a target duration (that is shorter than 100 fs, preferably shorter than 10 fs, more preferably shorter than 1 fs, and most preferably shorter than 500 attoseconds, having a duration between 100 and 500 attosecond, for example), is used to temporally gate the initial electron pulse at the material sample to effectuate the photon-electron coupling in the presence of nano-structures when the following two conditions are satisfied: i) the first optical pulse and the initial electron pulse are overlapped both in space and time (achieving what is referred to as spatiotemporal overlap), and ii) the energy-momentum conservation condition between the photons and electrons is satisfied. In this case, the inelastic gain/loss of photon quanta by the electrons in the electron packet takes place (which can be resolved in the electron energy spectrum) that includes discrete spectral peaks on the gain and loss energy sides of the zero-loss peak only in the presence of the second (gating) laser pulse. It is the interplay between the initial electron pulse and the gating optical pulse (in one embodiment—a pulse of visible light) that results in an optically-gated electron pulse with the desired target duration: the duration of the gated electron pulse depends on the temporal gating window that in turn is determined by the duration of the gating optical pulse.

As part of the same process, the second optical pulse (referred to as a "pump pulse" or a "trigger pulse", which in one implementation may be a pulse of near-IR light and, more preferably, a pulse of visible light) is delivered to the material sample substantially synchronously with the gating optical pulse to define a temporal profile of the gated electron pulse and to facilitate the imaging of the electron dynamics on the time scale of the target duration.

It was discovered that the implementation of the idea of the present invention—specifically, the photon-induced near-field electron microscopy (PINEM) possessing the target temporal resolution—can be implemented based on the photon-electron interaction. The basic principle of PINEM can be explained as follows:

In free space, an electron cannot absorb a quantum of electromagnetic energy because of the lack of energy-momentum conservation. However, in the presence of a nanostructure, inelastic coupling between free electrons and photons takes place due to the deceleration of the scattered photons and satisfaction of the energy-momentum conservation condition. The coupling leads to gain/loss of photon quanta by electrons in the electron packet, which can be resolved in the electron energy spectrum. This spectrum consists of discrete peaks, spectrally separated by multiples of the photon energy ($n\hbar\omega$), on the higher and lower energy sides of the zero loss peak (ZLP). The development of PINEM opens up the door for various applications such as the imaging of biological structures, visualization of plasmonic fields and their spatial interference, visualization of the spatiotemporal dielectric response of nanostructures, imaging of low-atomic-number nanoscale materials, and characterization of ultrashort electron packets.

The PINEM signal is produced due to the coupling between the electron pulse and the first laser pulse (both pulses are kept in spatiotemporal overlap during the experiment). Then, the electrons that gain and/or lose photon quanta (represented by the PINEM peaks) are used to "probe" the ultrafast dynamics of matter triggered by the second laser "pump" pulse.

As discussed below, in one specific case of implementing the idea of the present invention, the time-resolved PINEM was exploited to study the ultrafast phase transition dynamics of $VO_2$ nanoparticles from the initial (monoclinic) insulator phase to the (tetragonal) metal phase. The photo-induced dielectric response of $VO_2$—which is strongly related to the lattice symmetry—manifests itself in the change of the PINEM peaks intensities. Therefore, the ultrafast phase transition dynamics were retrieved by tracing the changes of these PINEM peak intensities as functions of the pump laser pulse delay.

Example 1

One embodiment 100 of the system of the invention is shown schematically in FIG. 1, and the principle is illustrated in the inset 110. In infrared laser pulse 112 (with a duration of several hundred femtosecond, in one non-limiting example—250 fs) with a central wavelength of $\lambda \sim 1039$ nm is used to generate a laser pulse having wavelength(s) in the visible portion of the optical spectrum. As shown, in one case the pulse 112 is frequency-doubled with the use of the nonlinear optical system 114 to generate a pulsed laser beam 116 of visible light (in this case—at a wavelength of about 519 nm). The pulsed laser beam 116 is divided into two beams by a dichroic beamsplitter 118.

The first visible laser beam 120 is utilized to generate DUV laser pulses ($\lambda \sim 259$ nm) through the second harmonic generation process in the system 122. The beam 124 carrying the UV pulses is directed to the photoemissive cathode 126 (inside the electron microscope 128) to generate a flux 130 of ultrafast electron pulses, which are appropriately accelerated in the column (~200 keV).

As shown, the second pulsed visible laser beam 132 is further spatially-divided into two pulsed beams of visible light 134, 136 by a second beamsplitter 138. One of these two beams carrying visible laser pulses ($P_1$) that are referred to as "gating" optical pulses—the beam 134—is directed with the use of appropriately disposed optical components (optionally—while additionally traversing an optical delay line 140) towards the contents of the sample holder 142 (for example, a material specimen 142A) to be coupled with the electron pulses 130 arriving to the sample 142A inside the microscope 128 in the presence of the specimen 142A to generate the PINEM peaks, while the electron pulses 130 and the optical pulses 136 are maintained in the spatiotemporal overlap. (In one case, the used material sample 142A contained $VO_2$ nanoparticles).

Another visible laser beam 136 (formed from the beam 132 and containing a stream of pulses $P_2$, referred to as pump or trigger pulses) is also delivered to the sample along the different optical path to induce phase transition in the $VO_2$ nanoparticles. The time delay ($\tau_2$) of a given pump pulse in the beam 134 with respect to the corresponding electron pulse 130 is optionally controlled by another precise linear delay stage 144. In one implementation, the joined operation of the optical delay lines 140, 144 is judiciously configured to ensure that the time-delay between the corresponding pulses from the beams 134, 136 arrive at the vicinity of the contents of the sample holder 142 with a time-delay that is shorter than 1 fs. In one implementation, the time-delay device(s) can be equipped with an appropriate phase-locking mechanism that ensures the active phase-locking between the optical pulses 134, 136.

The beams 134, 136 carrying, respectively, pulses 134A, 136A are spatially and temporally recombined and focused onto the specimen 142A in the microscope 128 and the electron energy spectrum of the resulting electron pulses 148—formed from the pulses 130 that have been gated with the pulses 134A and scanned or triggered with the pulses 236A—is acquired by an electron energy spectrometer 150.

The change in the intensity of the PINEM spectrum due to the photo-induced insulator-metal phase transition, traced with the spectrometer 150, is shown in FIG. 2. Here, each data point represents the integration of the PINEM spectrum at a certain delay time ($\tau_2$). This change reflects the dielectric response of the material sample 142A ($VO_2$ in this experiment) during the phase transition process. The PINEM spectrum intensity remains unchanged until the arrival of the pump pulse, when the phase transition of the $VO_2$ nanoparticles starts taking place. The dielectric properties of the nanoparticles are modified due to the change in the lattice structure during the phase transition. A biexponential fitting of the PINEM intensity dynamic curve (the solid curve 210 in FIG. 1) reveals two time constants (10 ps and ~170 ps); this is attributed to the vanadium atom motion within the unit cell and long-range shear rearrangement that is essential for the rutile phase transformation process. To confirm and validate this measurement, a conventional time-resolved electron diffraction measurement was conducted on the same material specimen under the same conditions. The results were in acceptable agreement, which demonstrates the validity of the time-resolved PINEM measurements. This demonstration opens the way for exploiting the PINEM technique to study the dynamics of matter in real time and space. For the purposes of this disclosure and the accompanying claims, a real-time performance of a system is understood as performance which is subject to operational deadlines from a given event to a system's response to that event. For example, a real-time extraction of information about an image of the designated target may be one executed simultaneously with and without interruption of the process of collection of image-forming energy from the target. In one non-limiting example, the real-time imaging of the structure and electron dynamics occurring at the material sample subject to the ultrafast PINEM measurement performed with the use of sub-femtosecond pulse(s) if the one producing at least one—and preferably more than one image during the duration of the shortest pulse involved in the occurring process.

Example 2

Figure 3:
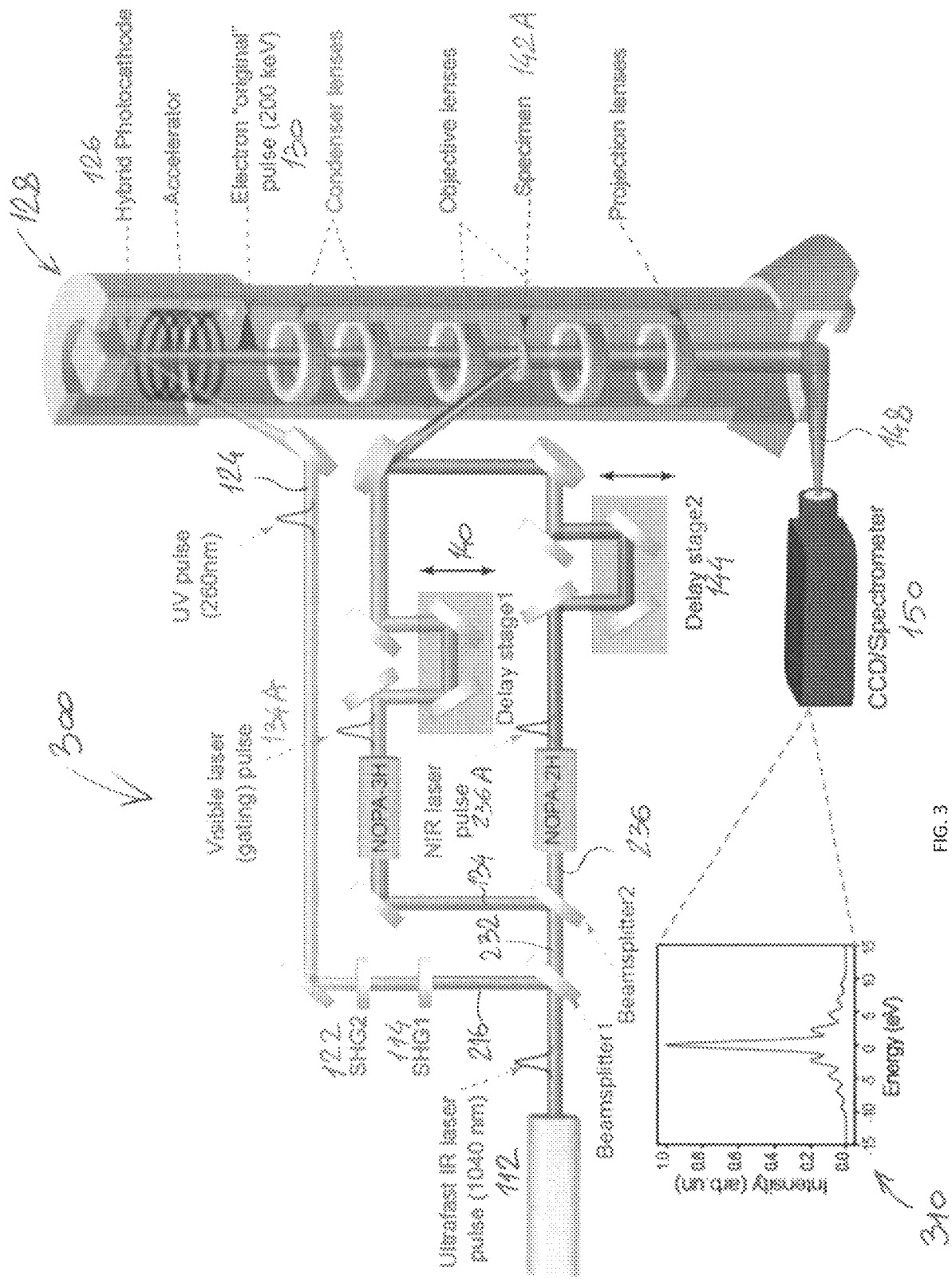
FIG. 3 schematically illustrates a related embodiment of the system of the invention.

A related embodiment 300 of the PINEM system of the invention is schematically illustrated in FIG. 3. Here, in comparison with the embodiment of FIG. 1, the pump beam of pulsed light 236 is formed as a beam of near-IR light. In light of the description of FIG. 1, the operation of the embodiment 300 will be readily understood by a person of skill in the art. (Notable, any of the approaches of FIGS. 1, 3 could be also applied for ultrafast electron diffraction setup using electron gun). A portion 216 of the beam 112 carrying infrared laser pulses generates the beam 124 with ultraviolet (UV) laser pulses using two sequential second-harmonic generation (SHG) processes in the SHG-sub-systems 114, 122. The pulses 124 are directed to the photoemissive cathode 126 of the EM 128 to generate ultrafast electron pulses 130 (of duration of several hundred fs). The remaining portion 232 of the beam 112 is divided into two beams (in one embodiment—of substantially-equal irradiance) 134, 236 sent to two non-linear optical parametric amplifier (NOPA) systems to generate visible optical "gating" pulses 134A (of sub 100-fs, preferably about 1 fs in duration, more preferably sub-femtosecond duration—for example between 100 and 500 attoseconds) and near-infrared (NIR) "pump" laser pulses 236A (of duration substantially equal to that of the pulses 134A). Generally, the frequency of the gating and pump laser pulses could be changed based on the imaging application. The delays between these pulses are controlled by linear delay stages, 140, 144. The beams 134, 236 carrying, respectively, pulses 134A, 236A are recombined and focused onto the specimen 142A in the microscope 128 and the electron energy spectrum of the resulting electron pulses 148—formed from the pulses 130 that have been gated with the pulses 134A and scanned or triggered with the pulses 236A—is acquired by an electron energy spectrometer. An energy spectrum for electron-visible photon coupling is shown in the inset 310.

Optical Gating of Ultrafast Electron Pulses

As was alluded to earlier, some of the electrons in the wave packet gain or lose multiple photon quanta only in the presence of the optical laser pulse, due to the photon-electron coupling in PINEM. This means that the optical pulse (in reference to FIG. 1—pulse in the beam 136) acts as a "temporal gate" for the electrons present at the surface of the sample 142A. These "gated" electrons have a temporal profile that emulates the gating window (i.e., the duration of the gating optical pulse 134A). According to the idea of the invention, this temporal can be filtered out to obtain ultrashort electron pulses, thus providing significant enhancement of the temporal resolution in electron microscopy for exploring ultrafast dynamics of matter triggered by other ultrashort optical laser pulses in different UEM modes (i.e., diffraction, electron spectroscopy, and/or direct imaging). In one implementation discussed below, the optical gating pulse 134A is formed to last a few hundreds of attoseconds (the pulse of attosecond duration), and, when used to gate the electron pulses 130, leads to the generation of few-femtosecond and/or sub-femtosecond and/or attosecond electron pulses. The term "attosecond duration" refers to and is defined as a duration of time that is shorter than one femtosecond. The term "sub-femtosecond" also refers to and is defined as a time duration that is shorter than one femtosecond.

A skilled artisan will readily appreciate, the temporal resolution achievable in the UEM implementations mainly depends on the duration of the electron pulse generated at the sample, which is finite due to the initial energy dispersion and the space-charge effect. In UEM systems of related art, the typical temporal resolution spans the range from several hundreds of femtoseconds to a few tens of picoseconds, which is insufficient to resolve the faster transient dynamics of matter lasting from few tens to few hundreds of femtoseconds. Hence, the generation of short (few tens of femtoseconds) electron pulses is highly desirable for enhancing the temporal resolution of UEM The process of optical gating with the use of the pulses 134A (having the femtosecond and, preferably, sub-femtosecond or attosecond, duration) generated with the embodiment of the system of the invention (such as the embodiment 100, for example) permits the temporal resolution and imaging of fast atomic motion and electron dynamics occurring on the scale of several tens of femtoseconds, preferably on the scale of 1 fs, and most preferably on the attosecond scale.

Example 3: Temporal Gating of a Several-Hundred-Fs Electron Pulse with an Approximately 30 fs Optical Gating Pulse In reference to FIGS. 4A, 4B, and 4C, in one experiment utilizing the embodiment 300 of the system of the invention, an ultrafast electron pulse 130 (of several hundred femtosecond duration) generated by photoemission inside the microscope 128 of FIG. 3 was temporally gated utilizing a 30 fs visible laser pulse 134A. First, the temporal profile of the "original" electron pulse 130 was characterized by cross-correlation between the "gating" visible pulse 134A and the electron pulse 130, as known in the art. Since the duration of the "gating" pulse 134A is much shorter, the cross-correlation directly reflects the temporal profile of the electron pulse 130. The retrieved pulse duration of these "original" electron pulses 130 was on the order of 500 fs. Second, for generating the isolated ultrashort "gated" electron pulse 148 with maximum counts, the "gating" pulse 134A was kept at the optimum temporal overlap ($\tau_{Vis}$=0 fs) with the 500 fs electron pulse 130.

Finally, the gated electron pulse, with the same temporal profile as the gating pulse 134, was characterized by using another, trigger laser pulse 236A and measuring its cross-correlation temporal profile with the gated electrons. The principle of this measurement is schematically illustrated in FIG. 5A.

The cross-correlation spectrogram (FIG. 5C) was recorded first. Then, the temporal profile of this cross-correlation was retrieved from the spectrogram, which carries the signature of the coupling between the original electron pulse 130 and NIR laser pulse 236A and that between the electron pulse gated with the visible pulse 134A and NIR laser pulse 236A. The cross-correlation temporal profile of the latter is shown in the inset of FIG. 5B, with a full width at half maximum (FWHM) on the order of 50 fs. Since the duration of the NIR pulse duration was about 33 fs, the duration of the gated electron pulse was demonstrated to on the order of 30 fs, similar to the temporal profile of the gating pulse 134A.

The generated "gated" electron pulse had sufficient electron counts (~8% of the total electron counts, or <1 electron/pulse) for probing the ultrafast electron dynamics of matter. The achieved temporal resolution (30 fs) allowed imaging of the electron dynamics lasting a few tens of femtoseconds, which was beyond that demonstrated by related art (such as that associated with the electron-electron scattering and electron-phonon coupling in semiconductors and the dynamics of surface plasmons, for example).

Example 4: Implementation of Methodology of Attomicroscopy

As a person skilled in the art will readily appreciate from the discussion presented above, the duration of the gated generated electron pulse is limited only by the duration of the gating laser pulse. Should the gating laser pulse be formed with the attosecond duration, the time-scale of electron motion imaging will be accordingly reduced. It should be noted that, in this case, the nanostructure system with photon-electron coupling should have a broadband response over the spectral bandwidth of the gated pulse. According to the idea of the invention, the superior phase and synchronization stability (<1 fs) can be achieved by active phase-locking between the two optical (pump and gating) pulses 134A, 136A. (In practice, such synchronization is not likely to be achieved with other electron-pulse-compression techniques. Accordingly, in the related implementation of the idea of the invention, the use of the (optionally temporally isolated) attosecond gating pulse 134A that was actively-phase-locked with the pump pulse 136 of the substantially-equal duration was considered the best candidate for achieving the attosecond resolution in electron microscopy.

Formation of Optical Attosecond Pulse

Figure 6:
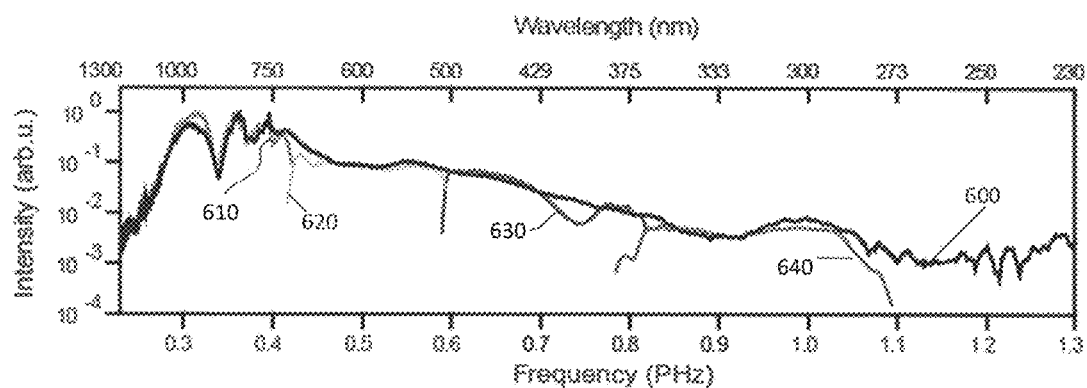
FIG. 6: Supercontinuum spectrum after the HCF is shown as curve 600, while the spectra of the individual channels, $Ch_{NIR}$, $Ch_{Vis}$, $Ch_{Vis-UV}$, and $Ch_{DUV}$ are shown curves 610, 620, 630, and 640, respectively.
Figure 7:
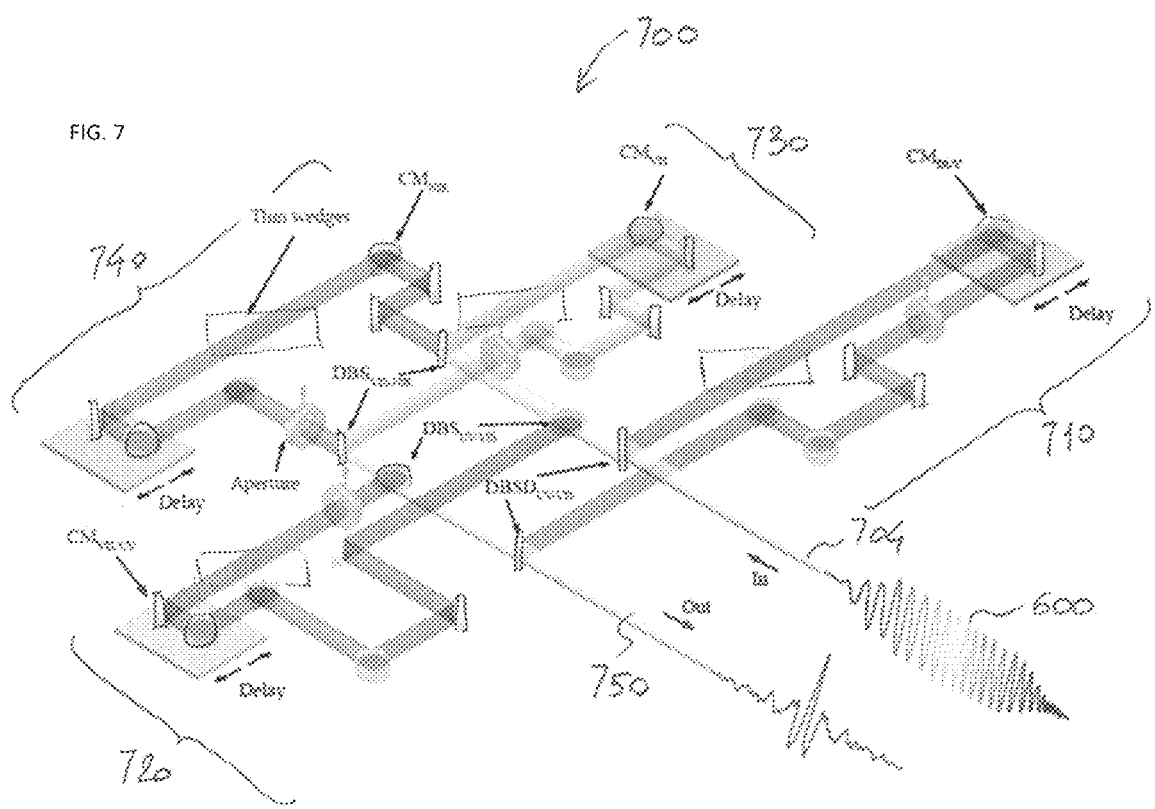
FIG. 7: a schematic of the embodiment of the attosecond-light-pulse synthesizer, having four optical channels.
Figure 8A:
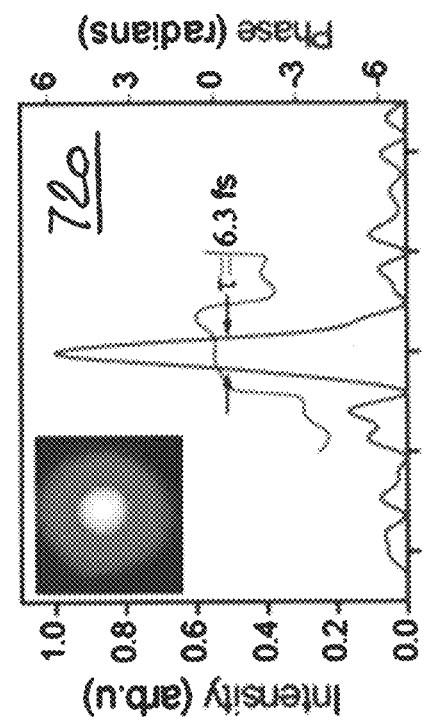
FIGS. 8A, 8B, 8C, and 8D: Results of al characterization of temporal characteristics of light pulses formed in the constituent channels of the four-channel pulse synthesizer of FIG. 7. The retrieved temporal profiles for the pulses in channels $Ch_{DUV}$ 710, $Ch_{Vis-UV}$ 720, $Ch_{Vis}$ 730, and $Ch_{NIR}$ 740 are shown, respectively, in FIG. 8A, FIG. 8B, FIG. 8C, and FIG. 8D.
Figure 8B:
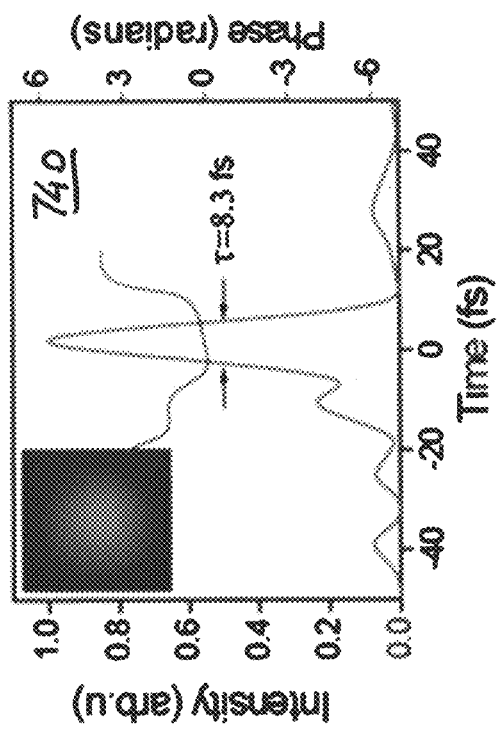
Figure 8C:
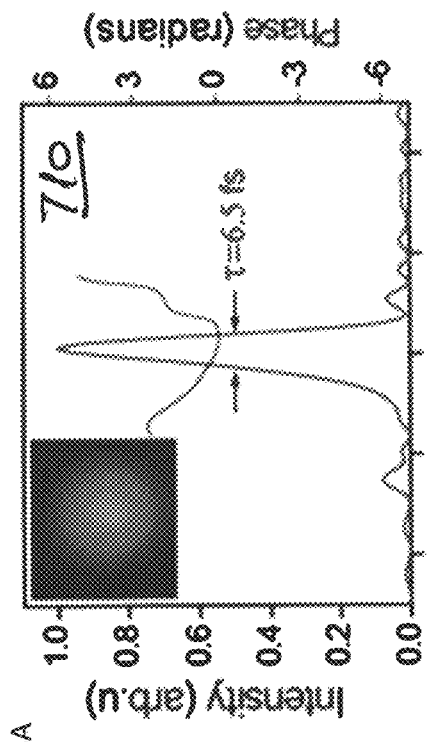
Figure 8D:
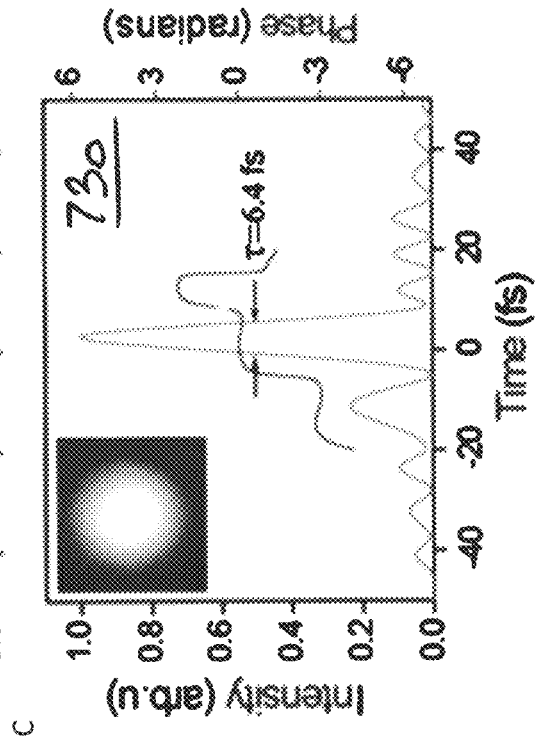

The generation of an attosecond pulse having a frequency spectrum that spans more than two octaves in the frequency space corresponding to the visible range and at least one immediately-adjacent-to-the-visible frequency range (the latter is now referred to and defined as "flanking" range or ranges of frequencies or wavelengths: whether that including UV wavelengths or that including IR wavelengths) was effectuated with the use of the light field synthesis approach. According to one implementation, the attosecond optical pulse was generated with the use of input light having a supercontinuum spectrum (illustrated in FIG. 6), by focusing multi-cycle laser pulses of 1 mJ (with a central wavelength of ~790 nm and a TFWHM pulse duration of ~22 fs) in a gas-filled Hollow Core Fiber (HCF). The example of the system configured for generation of attosecond-duration optical pulse is shown in FIG. 7. The Ne gas pressure inside the HCF chamber is adjusted to ~2.2 bar in order to maximize the bandwidth of the spectrum of the input light 704. The input light 704 is received by the embodiment 700 of the light field synthesizer, which was designed to synthesize the light pulse with attosecond duration. The supercontinuum frequency spectrum of light 704 (in one case— extending over at least two octaves across the visible spectral range and a flanking spectral range) is appropriately spatially divided, with the use of dichroic beamsplitters (DBSs), into several (shown as four, in this example)

constituent light channels 710, 720, 730, 740 light contents of which in this example have nearly equal spectral bandwidths utilizing Dichroic Beamsplitters (DBSs). (Generally, however, the spectral bandwidths of the constituent light channels may differ from one another.) The division of the ultrabroadband spectrum 600 inside the pulse synthesizer 700 is a step to achieve a time-compression of the input light pulse 704 to the target time duration limit and to generate the optical attosecond pulse. These four constituent spectral channels in the described example are: the near infrared (NIR) channel 740 ($Ch_{NIR}$, containing light within the band of 700-1300 nm), visible channel 730 ($Ch_{VIS}$, containing light within the band of 500-700 nm), visible-UV channel 720 ($Ch_{VIS-UV}$, containing light within the band of 350-500 nm), and deep ultraviolet channel 710 ($Ch_{DUV}$, containing light within the band of 270-350 nm), as shown in FIG. 17.

Inside the synthesizer apparatus 700, spectrally-dispersive (chirped) reflectors are placed in the beam paths of the corresponding channels ($CM_{NIR}$ in the NIR channel, $CM_{Vis}$ in the visible channel, $CM_{Vis-UV}$ in the visible-UV channel, and $CM_{DUV}$ in the DUV channel) to compensate for the positive dispersion of the light pulse in each of the channels 710, 720, 730, and 740. As a result of interaction with a given chirped reflector, the light pulse propagating in a given individual optical channel of the synthesizer 700 is temporally compressed to the duration that is close to the limit defined by the Fourie Transform of the corresponding spectral bandwidth of light propagating through such channel, and characterized with a TG-FROG apparatus (the basic example of which can be found en.wikipedia.org/wiki/Frequency-resolved_optical_gating)

The pulse durations (measures as FWHM) $\tau_{FWHM}$ of pulses compressed in each of the channels were determined to be: $\tau_{Ch(NIR)}$=8.3 fs, $\tau_{Ch(Vis)}$=6.4 fs, $\tau_{Ch(Vis-UV)}$=6.3 fs, and $\tau_{Ch(DUV)}$=6.5 fs, as shown in FIGS. 8A, 8B, 8C, and 8D.

At the exit/output of the apparatus 700, the constituent channel pulses are spatiotemporally superposed over one another with the use of beamsplitters of the same type, to form the output beam of light 750 carrying ultrashort pulse(s). Notably, various optical elements, components, and/or device have been employed to implement an embodiment 700 to control the waveform of the synthesized output pulse(s) 750, including: a) pairs of repositionable thin fused-silica wedges (apex: 2°48', 30×20 mm²) introduced in the beam path of at least some (and, preferably, each) of the individual channels and having apex angles equal to Brewster angles (that correspond to each of the spectral bands of light contents of the constituent channels each band, to minimize optical losses) to fine-tune the spectral dispersion of light in a given channel as well as the carrier-envelope phase (CEP) of the constituent pulses; b) adjustable iris apertures, introduced in the beam path of at least some (and, preferably, each) of the channels to control the relative irradiance values of light flux(es) among the constituent channels; c) translation units/repositioners, configured to carry a pair of mirrors in the path of at least some (and preferably, each) of constituent channels to adjust the relative phases of pulses among the channels. In one example, the repositioner with mirrors (shown in FIG. 7 as "delay line") includes a manually-adjustable translation stage (precision of about 10 μm), used for the coarse adjustment of the optical paths in individual channel, and a piezoelectric translation stage, which is used for finer adjustments of the time delays in individual channels with the necessary attosecond precision. In the implementation presented in FIG. 7, a rough optical path adjustment is possible for all optical channels along with fine adjustment (via piezoelectric stages) and is implemented for $Ch_{DUV}$, $Ch_{Vis-UV}$, and $Ch_{NIR}$. These elements enable field synthesis with attosecond resolution.

To improve the characteristics of the output light pulse(s) 750 at the exit of the synthesizer, the relative amplitudes of individual light components with different spectral bands that are being superimposed can optionally be controlled to achieve a quasi-equal (substantially equal) irradiances of lights in multiple constituent channels. This can be attained by adjusting the aperture(s) of the embodiment 700 and/or by additional introduction of band-pass filters in the constituent optical paths across the beams.

Figure 9A:
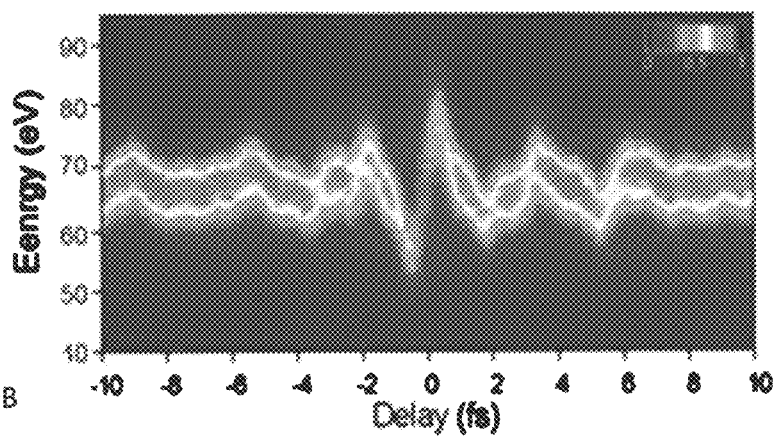
FIGS. 9A, 9B, 9C: Characterization of optical attosecond pulse (OAP).
Figure 9B:
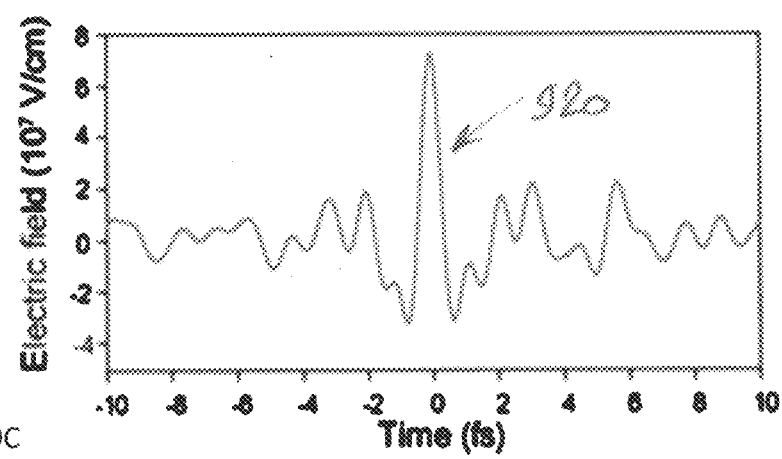
Figure 9C:
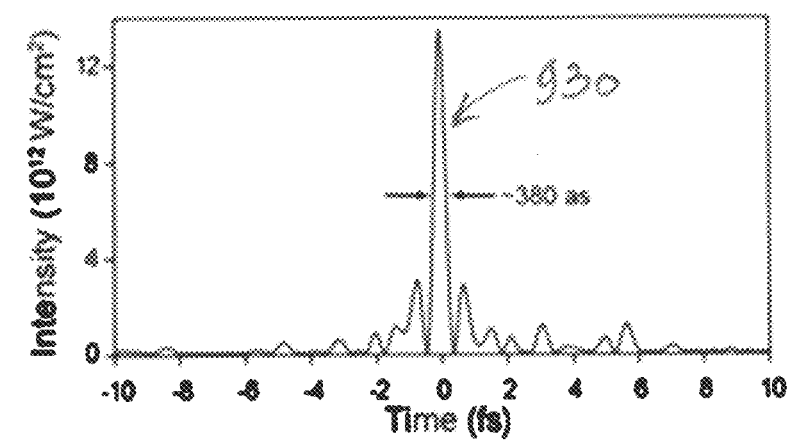

A person of skill in the art will readily appreciate now that in one implementation the multiple optical channels of the synthesizer 700 are stabilized both passively and actively. The active phase-locking is introduced to the synthesizer 700 to ensure the stability of the generated optical attosecond pulse 750 on the attosecond temporal scale (or, in a related embodiment, on another target temporal scale—for example, on the scale of a femtosecond). The adjustment of the irradiance of the ultrabroadband spectrum pulse can alternatively be done passively with a judiciously-structured optical element (in one case—a metallic-dichroic-metallic mirror), which in use causes the reshaping of the supercontinuum spectrum to the desired relative intensities over the two octaves leading to the generation of the optical pulse of attosecond duration (as shown in the example of FIGS. 9A through 9C). Here, the measured streaking spectrogram of the optical attosecond pulse is illustrated in FIG. 9A. The retrieved electric field is shown with curve 920 in FIG. 9B. In the plot of FIG. 9C, the central field crest of the curve 930 is about 5 times higher than crests corresponding to the adjacent half-cycles. The $\tau_{FWHM}$ duration of the central field crest was about 380 as, while the central wavelength of this optical attosecond pulse was about 530 nm.

Generation of Isolated Attosecond Pulse of Electrons

As mentioned earlier, the duration of the gated electron pulse depends on the temporal gated window, which is determined by the optical gating pulse. Therefore, the optical attosecond pulse could provide the sub-femtosecond temporal gating resolution required to generate isolated attosecond electron pulses with the optical gating approach. Moreover, extremely high phase stability (<1 fs) is achievable between the pump and gating laser pulses as a result of active phase-locking, to attain the attosecond temporal resolution in electron microscopy.

In the following simple theoretical calculation, a compensated 10 fs electron pulse) is gated by a few-cycle optical pulse (10 fs), as well as by the optical attosecond pulses (380 as). Here, the probability of a single electron emitting or absorbing photons through interaction with the surface of a nanostructure is calculated. The intensity of the optical pulse field is kept lower than the saturation threshold. In short, the electron-photon interaction is considered to be mediated with an evanescent electromagnetic field induced by the optical gating pulse hitting the surface. The spatial distribution of the evanescent field is determined by the optical properties and the geometry of the nanostructure. For simplicity, we assume an effective one-dimensional spatial distribution of the evanescent field.

Then, the strength of the evanescent field coupled with the electrons is given by $$E_z(z,t) = E_0 e^{-|z|/\xi} e^{-i\omega t - (t+\tau)^2/\tau_p^2}, \quad (1)$$

where $E_0$ is the peak strength of the evanescent field, $\xi$ is the penetration depth into vacuum, co is the photon frequency, T is the delay between the optical and electron pulses, and $\tau_p$ is the duration of the optical pulse. The temporal evolution of the electrons in the presence of the evanescent field can be described by a time-dependent Schrödinger equation including a light-matter coupling Hamiltonian with a classical electromagnetic field, whose solution can be found self-consistently by solving the Lippmann-Schwinger equation known in the art. By expanding the electron wave function into momentum eigenstates corresponding to gaining or losing a certain number of photons, the Lippmann-Schwinger equation can be solved. The expansion coefficients are given in a recursive manner. With the expansion coefficients, the probabilities of electrons gaining/losing L photons can be computed as $$P_L = \sum_{N=|L|}^{\infty} \sum_{N'=|L|}^{\infty} C_L^N (C_L^{N'})^* \frac{\exp\left\{-\frac{(N+N')(\tau/\tau_p)^2}{1+[(N+N')/2](\tau_e/\tau_p)^2}\right\}}{\sqrt{1+\left[\frac{(N+N')}{2}\right](\tau_e/\tau_p)^2}}, \quad (2)$$

where N and N' are the possible numbers of total scattering events, $C_L^N$ is the expansion coefficient of the electron wave function based on the momentum eigenstates corresponding to gaining or losing a certain number of photons, $\tau$ is the delay between the electron and "gating" optical pulses, $\tau_e$ is the electron pulse duration, and $\tau_p$ is the laser "gating" pulse duration.

The calculated electron energy spectrogram of the optical coupling between the 10 fs electron pulse and the 10 fs optical pulse (I=3×10$^{12}$ W/m$^2$) is shown in FIGS. 10A, 10B. Here, the calculated gated electron spectrogram of the 10 fs electron pulse with the 10 fs visible laser pulse centered at 800 nm is shown in FIG. 10B, and the outline of the electron spectrum at a delay time of 0 fs is shown in FIG. 10A. The gated electron spectrum is shown as area 1010, and the ZLP spectrum is shown in as area 1020.

The 10 fs temporal resolution is defined by the original electron pulse duration (in reference to FIG. 1—the pulse 130 arriving at the sample 142A; the optical gating approach is necessary to achieve the extremely high phase stability between the pump (optical) pulse and probe (gated electron) pulses for potential time-resolved electron microscopy experiments.

On the other hand, the attosecond optical gating of 10 fs electron pulses utilizing the OAP allows the generation of isolated attosecond electron pulses (See FIGS. 11A, 11B, 11C). For such a broadband "gating" optical pulse, the gating medium (nanostructure, sample 142A of FIG. 1) should have a broad frequency response (e.g., aluminum nanostructures, which support surface plasmon with lifetimes on the attosecond scale), and the gated electron spectral peaks are expected to exhibit energy broadening since the OAP spans more than two octaves (spectral FWHM=1.75 eV), as shown in FIGS. 11A and 11B. The optical gating efficiency in this case can be defined as the ratio of the number of gated electrons to the total number of electrons of the original electron pulse, which gating frequency depends on the durations of both the original electron pulse and optical pulse.

Figure 12:
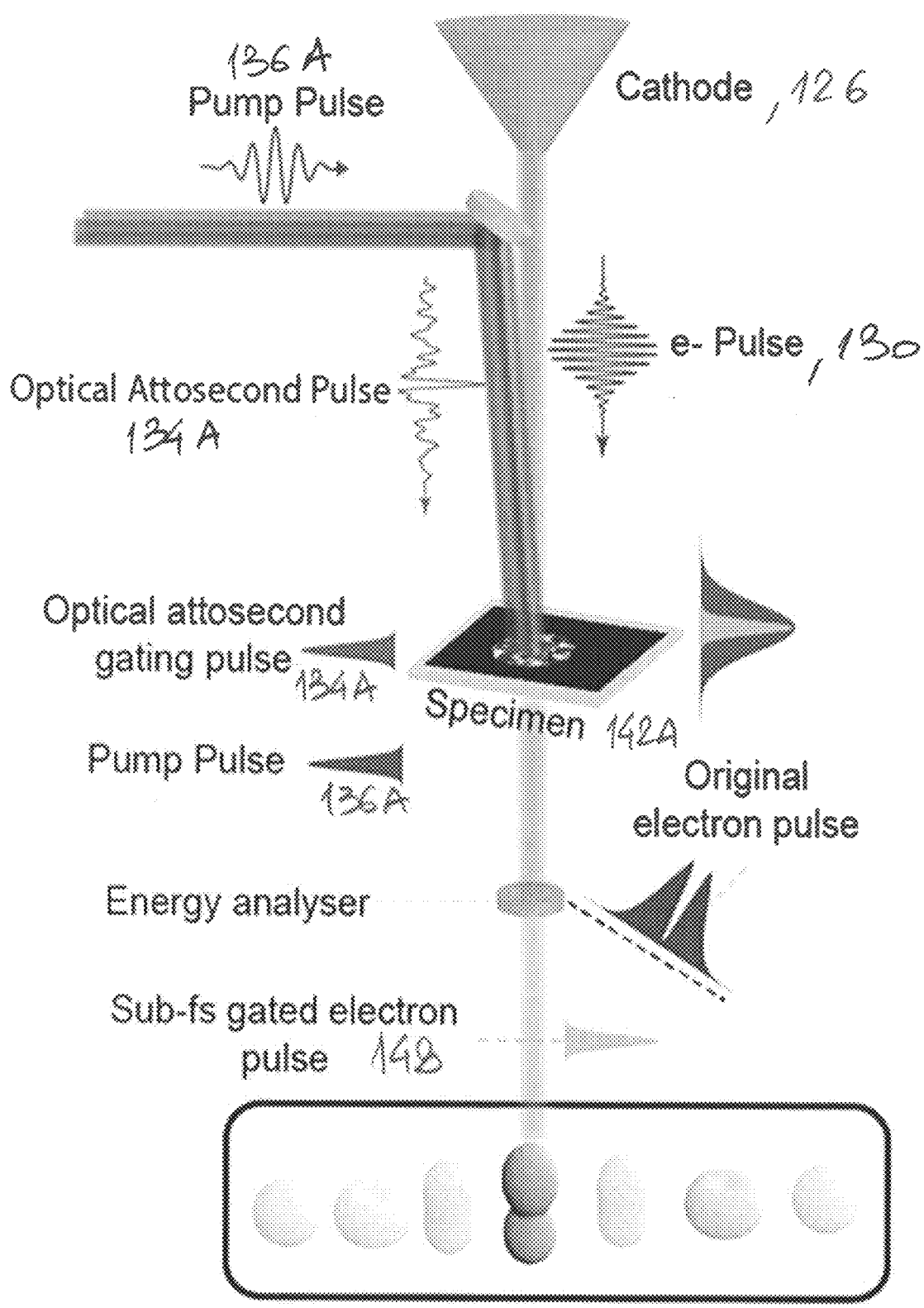
FIG. 12: Atomicroscopy: Imaging the electron motion in real time: a schematic illustration of an attomicroscopy setup. The optical attosecond pulse is used to provide the sub-femtosecond optical gating window for the original electron pulse in order to generate an isolated attosecond electron pulse. The optical gating and the generation take place at the sample stage. The generated gated pulse can be filtered out later, providing a desired probe resolution to image the electron motion in real time.

In an embodiment implementing the methodology of the time-resolved atomicroscopy, configured according to the idea of the invention and schematically-illustrated in FIG. 12. and in further reference to FIG. 1, the isolated attosecond "gated" electron pulse on the sample stage 142 is filtered out and utilized as a "probe" signal, while another optical pulse (such as the pule 136A, for example) is utilized as a "pump" to ultimately image the electron motion in real time. The isolated attosecond electron pulses 148 can be generated on or in the vicinity the surface of the nanostructure sample 142A, which facilitates maintaining the attosecond temporal resolution at the measured sample position (the dispersion of the gating optical pulse 134A can be controlled by the light field synthesizer 700 of FIG. 7, disposed, in the schematic of FIG. 1, across the beam 132 between the beamsplitters 118 and 138 (not shown in FIG. 1). In one implementation, nanogrid (a grid with nano-sized cells) made of aluminum can be additionally used as a nanostructure sample for attosecond optical gating of the electrons. Such grid can be used to complement the sample 142A and located directly above the sample 142A. In this way, the generated attosecond electron pulse 148 does not experience any substantial temporal broadening due to the space-charge effect in the attosecond electron pulse generation. Assuming a single electron for a beam diameter of 50 μm, the attosecond temporal resolution of the probe electron pulse can be preserved for propagation distances of up to 1 cm from the grid for electron pulses accelerated at 30 keV. The spatial resolution of the electron pulse generally depends on the sample where the gating takes place. Here, the nanometer spatial resolution is inherent to the generated attosecond pulse since the generation occurs on the nanometer grid.

Extremely high (better than 1 fs) temporal resolution and stability of imaging can be achieved with the use of active the phase-locking between the laser "pump" pulse 136A and the optical "gating" pulse 132A, which phase-locking also facilitates the minimization of the timing jitter and the fluctuation of the intensity of the "gated" electron pulse. The achievement of attosecond/nanometer spatio/temporal resolution in electron microscopy implemented according to the idea of the invention enables the femtosecond and attosecond imaging applications in different industrial and scientific applications.

It is appreciated, therefore, that the embodiment of FIG. 7 illustrates a source of light (optical source) that includes optical beamsplitters and optical phase-delay devices and is configured to perform at least the following functions, in operation: a) to spatially-separate an input beam of light (that is received at the input of the optical source and that has a defined spectral bandwidth) into a plurality of individual beams of light having respectively-corresponding spectral sub-bandwidths, while each of the sub-bandwidths is narrower than the defined spectral bandwidth; and b) to collinearly and temporally-coherently overlap at least two of the plurality of individual beams with one another to form the output beam at the output of the optical source, such output beam carrying light pulses of sub-femtosecond duration. Notably, in a specific implementation of the optical source 700, at least one of the following conditions is satisfied: (i) the optical source includes at least one system configured to compress light pulses carried by at least two individual beams before these at least two individual beams are collinearly and temporally-coherently overlapped with one another; (ii) the optical source is configured to collinearly and temporally-coherently overlap all of the individual beams from the plurality of individual beams; (iii) the optical source includes an irradiance attenuator disposed across an individual beam propagating between the constituent optical components of the optical source, and is configured to adjust irradiance of such individual beam to substantially equalize irradiances of at least two individual beams in question; and (iv) at least one of the optical phase-delay devices of the optical source includes an optical wedge disposed across at least one of the individual beams.

Imaging of Electron Motion in Real Time

The disclosed attomicroscopy technique can be used for imaging the electron motion dynamics indirectly. For example, the attosecond electron diffraction can be utilized to image the charge migration in molecules ionized by an optical pulse. (Such charge transfer was theoretically predicted in related art to evolve on a scale of a few femtoseconds.) In this case, the change migration through the molecule will affect the bond length, which can be resolved in both time and spatial domains by time-resolved electron diffraction measurements. Furthermore, the imaging of these dynamics can determine the subsequent relaxation pathways of the molecule. As another example, the proposed attomicroscopy methodology can be employed to image the electron and structural dynamics of molecules in gas phase. (It is understood from this disclosure, that to achieve the desired number of electrons in the gated attosecond electron pulse for a better signal-to-noise ratio, the duration of the initial electron pulse—pulse 130 in reference to FIG. 1—has to be on the order of several femtoseconds.)

As a person of ordinary skill in the art will readily appreciate, embodiments of the invention lend themselves to time-resolved imaging of the structural and electron dynamics. The structural and electron dynamical process of a sample under study is first triggered by attosecond optical pulse (the pump or trigger pulse 136A, in reference to FIG. 1). The ensuing change of the structural and electron dynamics at the sample 142A is then imaged in real time based on the electron pulse (probe pulse, 148 in reference to FIG. 1) the pulse duration of which is significantly shorter than the structural dynamics under investigation. The resulting diffraction patterns formed by strong interaction of attosecond electron pulse with the sample are then recorded in one embodiment with the use of the appropriate imaging unit of the electron microscope system and/or—in a related embodiment—with the use of a detection camera 150. The recorded diffraction pattern (a pattern of diffracted electrons) represents structural and electron dynamics information that has occurred at the sample, and the time-dependent variations of same are representative of the time-dependent variations of the electron dynamics and structural features of the sample. By adjusting the time difference between the arrival (at the sample) of the pump and probe beams, a series of diffraction patterns is obtained as a function of the time delays which are precisely controlled with appropriate delay stage(s) or lines. A thorough characterization of transient structural and electron dynamics can be obtained by analysis of the snapshots of the so-acquired diffraction patterns taken at different delay times.

After the electron-diffraction pattern(s) is recorded (optionally—as a function of time; either with the use of built-in capabilities of the electron microscope system or with an external-to-the-electron-microscope imaging system) and stored as respectively-corresponding sets of data with the use of a data-processing circuitry of the imaging system (not shown in Figures for the simplicity of illustration), an appropriate phase-retrieval algorithm may be used to obtain direct, visually-perceivable image and/or sequence of images (video) of attosecond electron dynamics and structure dynamics. Indeed, the acquired diffraction-pattern-representing data contains information about the absolute counts of electrons received by the imaging portion of the detection unit, thereby lacking the relevant phase information. Since the phase encodes a lot of the structural content of the image, the phase of the diffraction patterns should be recovered. (In order to obtain an interpretable map of electron density across each of the acquired image frames, both amplitude and phase must be known.) In one implementation, for example, a phase retrieval algorithm is employed to reconstruct the real space structure. Given a complex signal F(k), of amplitude |F(k)| and phase ψ(k):

$$F(k)=|F(k)|e^{i\psi(k)}=\int_{-\infty}^{\infty}f(x)e^{-2\pi ik\cdot x}dk \qquad (3)$$

where x is an M-dimensional spatial coordinate and k is an M-dimensional spatial frequency coordinate, the process of phase retrieval includes the process of finding the phase value(s) that for a measured amplitude satisfies a set of known constraints. The structural features of the imaged sample are than retrieved by iteratively comparing the acquired data with a theoretical model. (Descriptions of various phase-retrieval algorithms are presented, for example, in *Applied Optics*, January 2013, vol. 52, pp. 45-56, Phase retrieval algorithms: a personal tour, by James Fienup; or in *IEEE Signal Processing Magazine, May* 2015, pp. 87-109 (digital identifier 0.1109/MSP.2014.2352673), Phase Retrieval with Application to Optical Imaging, by Shechtman et al.; the disclosure of each of which publications is incorporated herein by reference.) The typical procedure of the phase retrieval algorithm can be summarized as follows:

Input the diffraction patterns

Analyze the constraints applied on object plane

Apply the phase retrieval algorithm

Finally, a series of visually-perceivable images is produced, which can be stacked together to form a video of attosecond molecular, atomic and electron movies motion in real space and/or real time. Accordingly, embodiments of the invention provide methodology that includes a) formation of a diffraction pattern caused in a far-field by an electron pulse having the sub-femtosecond duration; and b) formation of at least one image—and, preferably, a series of images—representing object dynamics with a target time resolution, that is carried out by acquiring energy of the electron pulse having the sub-femtosecond duration with an energy spectrometer and using the phase retrieval algorithm to extract the phase parameters corresponding to the readings of the energy spectrometer and to combine such phase parameters with the readings of the energy spectrometer.

Overall, the proposed methodology of generation of attosecond electron pulses and the establishment of attomicroscopy opens new venues and allow for a great number of femtosecond and attosecond electron imaging applications in different areas. Examples of such imaging applications—in particular those in the field of chemistry and biology—are provided by Hassan in topical review published by *J. Phys. B: At. Mol. Opt. Phys.* 51 032005, 2018, the entire disclosure of which is incorporated herein by reference.

FIGS. 13, 14, and 15 provide schematic flow-charts representing embodiments of the method of invention. FIG. 13, for example, illustrates the method for forming sample images with an electron microscope. Here, at step 1310, the first groups of free electrons is generated at the sample (in a form of a first electron pulse having a first duration), followed by generation of the second groups of free electrons (in a form of a second electron pulse having a second duration) as a result of irradiation of the first group of electrons with the first pulse of light, at step 1320. The second group of electrons is then transformed or modified into an irradiated second group of electrons by the second pulse of light, at step 1330, which may be performed with a preliminary (optional) step 1320A, at which the phase difference between the first and second light pulses with time precision value that is no larger than a time duration of the first pulse of light. Here, the durations of the first and second light pulses may be chosen to be substantially equal. Images of the irradiated second group of electrons are then formed, at step 1340, based on the energy spectrum acquired with the spectrometer.

FIG. 14 provides a schematic illustration of a method for imaging an electron motion, according to which the gated pulse of electrons is formed, from the initial pulse of electrons generated in the electron microscope, by irradiating at step 1410 the group of electrons representing this initial pulse of electrons with the first optical pulse. Caused by a spatial overlap of the second optical pulse with the gated electron pulse at step 1430, a diffraction pattern of the gated electron pulse is formed, 1430A, and/or a series of images is generated (with a sub-femtosecond time resolution) based on analysis of such diffraction pattern. While causing the spatial overlap between the first and second electron pulses, the phase difference between these two optical pulses may be adjusted and/or actively phase-locked to temporally scan the gated electron pulse with the second optical pulse, 1440.

A process of generating an electron pulsed of attosecond duration is schematically illustrated in FIG. 15. Here, at 1520, the material object is irradiated with a specifically-formed, 1510, ultra-short optical pulse to cause the object to emit the desired electron pulse. As part of the formation of the attosecond optical pulse, different constituent attosecond-optical-pulse contributing optical pulses can be exposed to different propagation delays, at 1510A. The process of irradiating the object with the attosecond optical pulse may be performed substantially simultaneously with the process 1530 of formation of a groups of free electrons at the object by an auxiliary pulse of electrons that has a femtosecond duration and that has been formed outside of the object, 1530A. Imaging of electron dynamics, occurring on the attosecond time-scale at the object is then effectuated by judiciously collecting time-dependent energy of a portion of the auxiliary electron pulse that has been gated with the attosecond optical pulse, 1540 (in one case—based on correlation between the gated portion of the auxiliary electron pulse and yet another optical pulse as a result of temporally scanning the former with the latter.

As a skilled artisan will readily appreciate, the operation of the system of the invention can be controlled with a programmable processor (not necessarily shown in the drawings) controlled by instructions stored in a memory. Such programmable processor in this case is operably coordinated with at least one of the first and second diffractive optical devices to govern their operation, as well as an optical detection unit (not shown in Figures) positioned to acquire light that has interacted with a given diffractive optical device. The memory may be random access memory (RAM), read-only memory (ROM), flash memory or any other memory, or combination thereof, suitable for storing control software or other instructions and data. Those skilled in the art should also readily appreciate that instructions or programs defining the functions of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks.

In addition, while the invention may be embodied in software, the functions necessary to implement the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

For the purposes of this disclosure and the appended claims, the term target temporal resolution is defined as a time resolution that is better than one femtosecond, preferably better than 500 attosec, preferably better than 100 attosec, preferably better than 10 attosec.

The use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself. The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

A reference to "substantially equal" spectra defines first and second optical spectra the frequency content of which is the same, while the amplitudes of radiation at the same frequency may optionally differ from one another (as in the case when, for example, the second spectrum represents an attenuated version of the first spectrum). Other specific examples of the meaning of the terms "substantially", "about", and/or "approximately" as applied to different practical situations may have been provided elsewhere in this disclosure.

Disclosed aspects, or portions of these aspects, may be combined in ways not listed above. Accordingly, the invention should not be viewed as being limited to the disclosed embodiment(s).

The invention claimed is:

1. A method for generating an electron pulse having an attosecond duration, the method comprising:

irradiating an object with an auxiliary femtosecond electron pulse; and illuminating the object, that has been irradiated with said auxiliary electron pulse, with an optical pulse having a sub-femtosecond duration to cause the object to emit the electron pulse having the attosecond duration.

2. The method according to claim 1, comprising:

spatially separating a first beam of light having a first spectral bandwidth into a plurality of second beams of light, a second beam from said plurality of the second beams of light having a corresponding second spectral bandwidth,
   wherein the first beam of light is a beam of pulsed laser light;

individually compressing light pulses of at least two second beams, from the plurality of the second beams, to form a plurality of third beams of light,
   wherein each third beam from said plurality of the third beams of light respectively corresponds to one of the second beams,
   wherein each third beam contains compressed light pulses having a corresponding compressed duration;

collinearly and temporally-coherently overlapping at least two of the third beams to form a fourth beam of light, the fourth beam carrying said optical pulse of light having said sub-femtosecond duration; and irradiating the object with said fourth beam to cause the object to emit said electron pulse having the attosecond duration.

3. The method according to claim 2, wherein at least one of the following conditions is satisfied:

a) wherein the spatially separating the first beam of light into the plurality of the second beams of light includes spatially separating the first beam of light into the plurality of the second beams of light while second spectral bandwidths, corresponding to different second beams, do not overlap with one another;

b) wherein the individually compressing the light pulses of the second beams includes individually compressing light pulses of each of the second beams;

c) wherein said collinearly and temporally-coherently overlapping at least two of the third beams includes collinearly and temporally-coherently overlapping all of the third beams;
and
d) wherein said individually compressing the light pulses of the second beams includes at least one of the following:
   (d1) forming said plurality of third beams in which each of the compressed durations is shorter than 10 femtoseconds, and
   (d2) spatially separating the second beams from one another to pass said second beams along corresponding optical paths that differ from one another.

4. The method according to claim 2, wherein said individually compressing includes impinging light pulses of at least one of said second beams on an optical element that is configured to cause a first propagation delay to be shorter than a second propagation delay,
   wherein the first propagation delay is a first time-delay that a first portion, of said light pulses of the at least one of said different second beams, experiences upon interaction with the optical element,
   wherein said second propagation delay is a second time-delay that a second portion, of said light pulses of the at least one of said different second beams, experiences upon interaction with the optical element, and
   wherein the first portion contains light with optical wavelengths that are shorter than optical wavelengths of light contained in the second portion.

5. The method according to claim 1, further comprising generating a group of free electrons at the object; and
   wherein said illuminating includes illuminating the group of free electrons with the fourth beam of light substantially simultaneously with said generating, to form a sub-set of the group of free electrons configured as said electron pulse having the attosecond duration.

6. The method according to claim 5, wherein at least one of the following conditions is satisfied:

(a)
   wherein said irradiating the object with the auxiliary femtosecond electron pulse includes irradiating said object with the auxiliary femtosecond electron pulse that has been generated outside of the object with the use of an optical pulse of light;
and
(b) further comprising at least one of:
i) forming a diffraction pattern caused in a far-field by said electron pulse having the attosecond duration; and
ii) forming a series of images, representing object dynamics with a target time resolution, by acquiring energy of the electron pulse having the attosecond duration with an energy spectrometer.

7. The method according to claim 5, wherein the sub-set of the group of free electrons is configured as the electron pulse that has a duration that is no longer than 500 attoseconds.

8. A method for imaging an electron motion in real time, the method comprising:

forming a gated electron pulse by spatially and temporally overlapping an initial electron pulse with a first optical pulse in the presence of an object material, the first optical pulse having a first temporal profile, the gated electron pulse having a gated temporal profile and a first duration, the first duration being an attosecond duration;
and
   as a result of spatially overlapping a second optical pulse, having a second temporal profile, with the gated electron pulse, forming at least one of
(i) a series of direct images of the object by processing the gated electron pulse with the use of an electron microscope; and
(ii) a series of images of the object based on diffraction patterns formed in a far-field by said gated electron pulse.

9. The method according to claim 8, wherein the diffraction pattern represents cross-correlation of the second temporal profile with the gated temporal profile.

10. The method according to claim 8, wherein said forming the gated electron pulse includes coupling the first optical pulse with the initial electron pulse, incident onto an object, in the presence of the object material while preserving a spatial overlap and a temporal overlap between the first optical pulse and the initial electron pulse.

11. The method according to claim 10, wherein said gated temporal profile of the gated electron pulse is substantially equal to the first temporal profile of the first optical pulse.

12. A method according to claim 8, further comprising actively phase-locking the first and second optical pulses to within a phase difference corresponding to a time extent of less than 1 femtosecond to cause temporal resolution of said method to be better than one femtosecond.

13. The method according to claim 8, further comprising changing a phase difference between a phase of the gated electron pulse and a phase of the second optical pulse with the use of active phase-locking between the first and second optical pulses
   a) to temporally scan the gated electron pulse with the second optical pulse, and
   b) to define a temporal profile of said gated electron pulse from correlation, between the gated electron pulse and the second optical pulse, that has been determined as a result of temporally scanning of the gated electron pulse with the second optical pulse.

14. A method for forming images of a sample with an electron microscope, the method comprising:
   at a location at the sample, generating a first group of free electrons in a form of a first electron pulse having a first duration;
   forming a second group of free electrons in a form of a second electron pulse having a second duration by irradiating the first group with a first pulse of light having a first light pulse duration and a first state of polarization,
      wherein the second group is a subset of the first group,
      wherein the first light pulse duration at the location is equal to or shorter than a predetermined duration;
      wherein the first duration is longer than the first light pulse duration;
      wherein the second duration is substantially equal to the first light pulse duration; and
      wherein the predetermined duration is the shortest duration supported by a spectral bandwidth of the first pulse of light;
   irradiating the second group of free electrons with a second pulse of light having a second light pulse duration and a second state of polarization to form an irradiated second group of free electrons,
      wherein the first and second states of polarization are different from one another;
   and
   forming
      (i) a direct image of the sample by processing the gated electron pulse with the use of an electron microscope; or
      (ii) an image of the sample based on diffraction patterns formed in a far-field by said gated electron pulse
   to record a series of images of the sample with a time resolution of less than the predetermined resolution.

15. A method according to claim 14, wherein at least one of the following conditions is satisfied: a) said irradiating the second group of free electrons includes irradiation the location at the sample; and b) wherein the predetermined duration is shorter than 100 fs.

16. A method according to claim 14, wherein said forming the image of the sample based on diffraction patterns formed in a far-field by said gated electron pulse includes determining an irradiance representing the gated electron pulse from said diffraction pattern recorded with a detector and reconstructing the image with the use of a phase-retrieval algorithm.

17. A method according to claim 14, wherein the second light pulse duration and the first light pulse duration are substantially equal.

18. A method according to claim 14, further comprising stabilizing a difference in temporal phase between the first and second laser pulses at the location by compensating time uttering between the first and second pulses of light with a time precision of less than the predetermined duration.

19. A method according to claim 14, wherein the predetermined duration is shorter than 1 fs.

20. A method according to claim 14, wherein the predetermined duration is shorter than 500 attoseconds.

* * * * *